United States Patent
Moon et al.

(10) Patent No.: US 10,097,742 B1
(45) Date of Patent: Oct. 9, 2018

(54) CONTROL CIRCUIT OF LIQUID LENS, CAMERA MODULE AND METHOD OF CONTROLLING LIQUID LENS

(71) Applicant: LG INNOTEK CO., LTD., Seoul (KR)

(72) Inventors: Young Seop Moon, Seoul (KR); Young Woon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/896,772

(22) Filed: Feb. 14, 2018

Related U.S. Application Data

(63) Continuation of application No. PCT/KR2018/001827, filed on Feb. 12, 2018.

(30) Foreign Application Priority Data

| Apr. 11, 2017 | (KR) | 10-2017-0046982 |
| Apr. 11, 2017 | (KR) | 10-2017-0046983 |
| Jan. 17, 2018 | (KR) | 10-2018-0005894 |

(51) Int. Cl.
*H04N 5/225* (2006.01)
*G01R 27/26* (2006.01)
(Continued)

(52) U.S. Cl.
CPC ....... *H04N 5/2254* (2013.01); *G01R 27/2605* (2013.01); *G02F 1/29* (2013.01);
(Continued)

(58) Field of Classification Search
None
See application file for complete search history.

(56) References Cited

U.S. PATENT DOCUMENTS

| 7,388,705 B2 * | 6/2008 | Onuki | G02B 3/14 |
| | | | 348/E5.028 |
| 2008/0062529 A1 | 3/2008 | Helwegen et al. | |

(Continued)

FOREIGN PATENT DOCUMENTS

| JP | 2007-516410 A | 6/2007 |
| KR | 10-2007-0008921 A | 1/2007 |

(Continued)

OTHER PUBLICATIONS

Korean Office Action dated Oct. 10, 2017 in Korean Application No. 10-2017-0046983.

(Continued)

*Primary Examiner* — Mark T Monk
(74) *Attorney, Agent, or Firm* — Saliwanchik, Lloyd & Eisenschenk

(57) ABSTRACT

Disclosed is a liquid lens control circuit, which includes a liquid lens including a plurality of individual electrodes disposed in compartmental areas at the same level and a common electrode disposed at a different level from that of the individual electrodes, a voltage control circuit configured to supply voltages to the common electrode and at least one of the individual electrodes in the liquid lens in order to control an interface in the liquid lens, and a capacitance measuring circuit configured to calculate a capacitance between the common electrode and at least one of the individual electrodes in the liquid lens using a switched capacitor.

19 Claims, 11 Drawing Sheets

(51) Int. Cl.
    *G02B 27/64*     (2006.01)
    *G02F 1/29*     (2006.01)
    *G03B 13/36*     (2006.01)
    *G03B 5/00*     (2006.01)

(52) U.S. Cl.
    CPC ............ *G03B 13/36* (2013.01); *G02B 27/646* (2013.01); *G02F 2001/294* (2013.01); *G02F 2201/121* (2013.01); *G03B 5/00* (2013.01)

(56) References Cited

U.S. PATENT DOCUMENTS

2009/0135484 A1     5/2009    Weber et al.
2012/0026596 A1     2/2012    Berge et al.

FOREIGN PATENT DOCUMENTS

| | | |
|---|---|---|
| KR | 10-2008-0014274 A | 2/2008 |
| KR | 10-2009-0018965 A | 2/2009 |
| WO | WO-2005/096035 A1 | 10/2005 |

OTHER PUBLICATIONS

International Search Report dated Jun. 15, 2018 in International Application No. PCT/KR2018/001827.

\* cited by examiner (a)   (b)

Fig. 5(a)    Fig. 5(b)    Fig. 5(c)
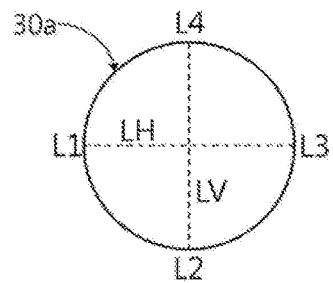 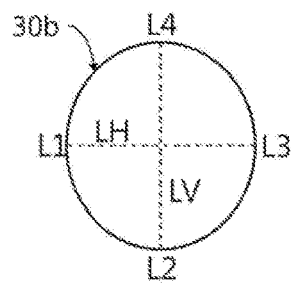 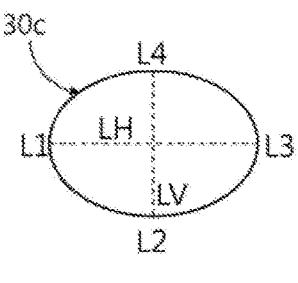
Fig. 6
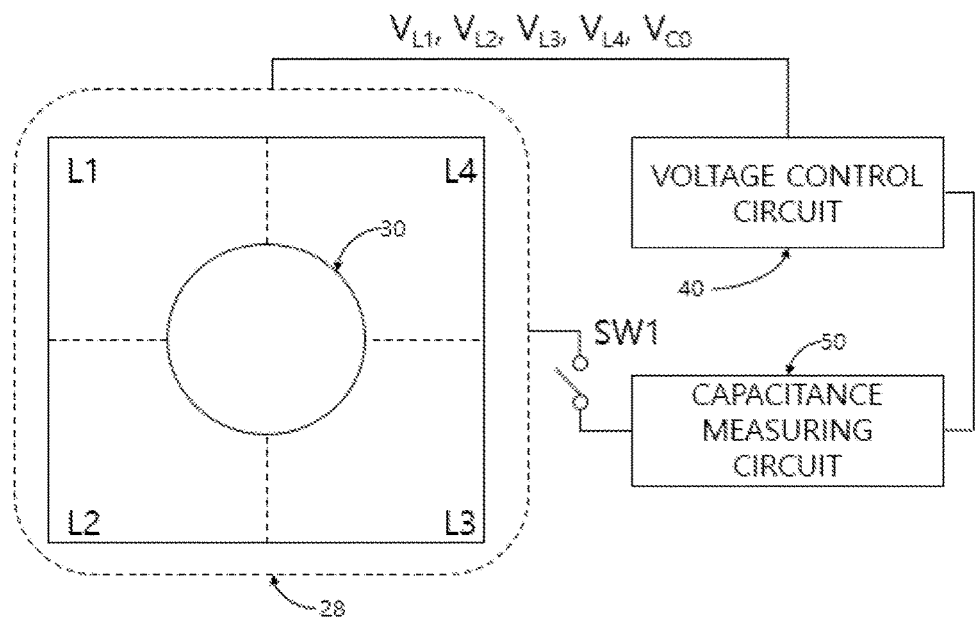

Fig. 15(a)  Fig. 15(b)  Fig. 15(c)
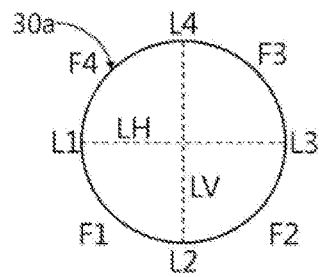 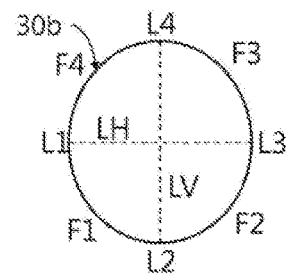 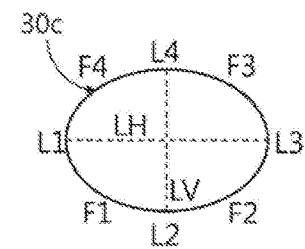
Fig. 16(a)
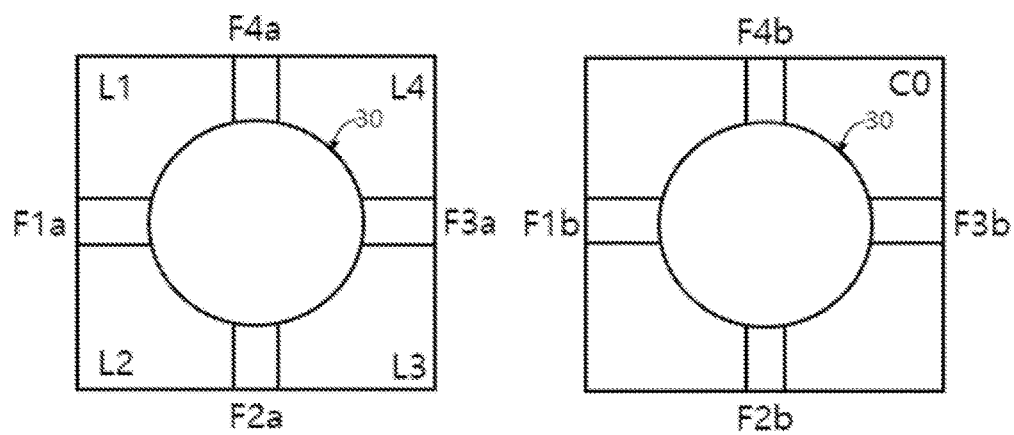
Fig. 16(b)
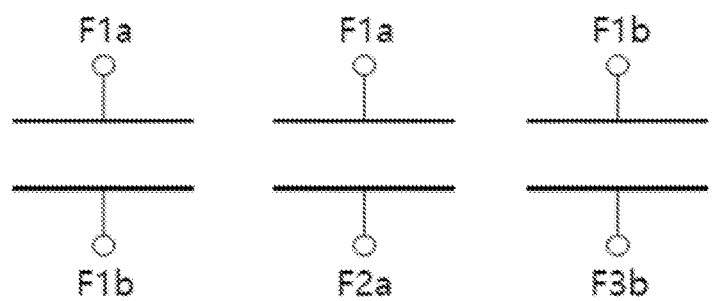

CONTROL CIRCUIT OF LIQUID LENS, CAMERA MODULE AND METHOD OF CONTROLLING LIQUID LENS

CROSS-REFERENCE TO RELATED APPLICATIONS

This application is a continuation of International Patent Application No. PCT/KR2018/001827, filed Feb. 12, 2018, which claims priority to Korean Application Nos. 10-2017-0046982, filed Apr. 11, 2017; 10-2017-0046983, filed Apr. 11, 2017; and 10-2018-0005894, filed Jan. 17, 2018, the disclosures of each of which are incorporated herein by reference in their entirety.

TECHNICAL FIELD

Embodiments relate to a liquid lens, and a camera module and an optical device having the same. More particularly, embodiments relate to a camera module and an optical device, which include a control module or a control device to control a liquid lens, the focal length of which may be adjusted using electricity.

BACKGROUND ART

Users of portable devices have a desire for optical devices that exhibit a high resolution and a small size and have various photographing functions (e.g., optical zoom-in/zoom-out, auto-focusing (AF), and anti-handshaking or optical image stabilization (OIS) functions). Although these photographing functions may be implemented by combining several lenses and directly moving the lenses, the size of an optical device may be increased when the number of lenses is increased. Auto-focusing and anti-handshaking functions are implemented by moving or tilting several lens modules, which are fixed to a lens holder so as to be aligned with the optical axis, along the optical axis, or in the direction perpendicular to the optical axis, and a separate lens-driving device is used to drive the lens modules. However, the lens-driving device exhibits high power consumption, and a glass cover needs to be separately added to the camera module in order to protect the lens drive device, thereby increasing the overall thickness.

DISCLOSURE

Technical Problem

Studies have been conducted on a liquid lens, which performs auto-focusing and anti-handshaking functions by electrically adjusting the curvature of an interface of two types of liquids. Therefore, it is one object of the embodiments of the subject invention to provide, in a camera module, which includes a liquid lens, the focal length of which may be adjusted using electricity, a feedback circuit, which may recognize the state of an interface included in the liquid lens from variation in capacitance, whereby movement of the boundary interface in the liquid lens may be more accurately recognized based on the applied electricity and the boundary interface in the liquid lens may be more accurately controlled.

In addition, it is another object of the embodiments to provide, in a liquid lens, which has a relatively small capacitance (e.g., within a range from 200 pF to 500 pF), but receives a relatively high voltage (e.g., within a range from 30V to 50V or more) at opposite ends thereof, a measuring circuit and/or a feedback circuit, which may measure variation in capacitance inside the liquid lens.

In addition, it is another object of the embodiments to provide a device and a method, which measure the capacitance between a common electrode and an individual electrode disposed in a liquid lens, the focal length of which may be adjusted, by applying a ground voltage to the common electrode, and floating the common electrode in a falling-edge state in which the individual electrode falls from a high voltage (e.g., within a range from 10V to 50V or more) to the ground voltage.

In addition, it is another object of the embodiments to provide a device and a method, which measure the capacitance between a common electrode and an individual electrode disposed in a liquid lens, the focal length of which may be adjusted, by floating the common electrode during and immediately after a falling-edge state in which the individual electrode falls from a high voltage (e.g., within a range from 10V to 50V or more) to a ground voltage.

In addition, it is another object of the embodiments to provide a liquid lens structure, which may include a separate electrode, which may apply a capacitance measuring feedback voltage (e.g., within a range from 1.5V to 5V) that is significantly lower than a drive voltage (e.g., within a range from 30V to 50V or more) so as to measure the capacitance of an interface included in a liquid lens, between electrode sectors disposed in the liquid lens.

In addition, it is another object of the embodiments to more rapidly and accurately control the performance and operation of a liquid lens, the focal length of which may be adjusted, by directly recognizing the movement and shape of an interface in the liquid lens from variation in the capacitance of the boundary interface, rather than recognizing the movement and shape of the boundary interface in the liquid lens by converting optical signals that have passed through the boundary interface into an image.

In addition, it is a further object of the embodiments to provide a camera module and/or an optical device, which more efficiently corrects lens distortion of a lens assembly including a liquid lens and a solid lens, or more efficiently controls the lens assembly by recognizing the movement and shape of an interface in the liquid lens.

The objects of the embodiments should not be limited to the aforementioned objects, and other unmentioned objects will be clearly understood by those skilled in the art from the following description.

Technical Solution

In accordance with one embodiment, a device for controlling a liquid lens can include a liquid lens including a common electrode and a plurality of individual electrodes; a voltage control circuit configured to supply a driving voltage to the liquid lens such that it controls an interface in the liquid lens; a capacitance measuring circuit configured to measure capacitance between the common electrode and the plurality of individual electrodes in the liquid lens; and a first switch located between the capacitance measuring circuit and the liquid lens, wherein one side of the first switch is electrically coupled with the liquid lens and the voltage control circuit, the capacitance measuring circuit is capable of measuring the capacitance between the common electrode and at least one individual electrode of the plurality of individual electrodes, and the voltage control circuit is configured to control the driving voltage based at least on the capacitance and/or information determined by the capacitance measured by the capacitance measuring circuit.

The capacitance measuring circuit can be configured to measure the capacitance between the common electrode and each individual electrode of the plurality of individual electrodes.

When the common electrode is floating after a ground voltage is supplied into the common electrode after a shape of the interface is changed by the driving voltage, the capacitance can be measured during a period when the first switch is turned on and a voltage supplied into the at least one individual electrode is changed from a first voltage into a second voltage having a lower level than the first voltage.

The first switch can be turned off when the voltage control circuit supplies the driving voltage into the liquid lens for operating the liquid lens.

The voltage control circuit can be configured to generate the driving voltage used for operating the liquid lens as well as to accumulate electric charge used for measuring the capacitance on the liquid lens.

The capacitance measuring circuit can include a reference capacitor, and the capacitance of the liquid lens can be measured by using the reference capacitor.

The capacitance measuring circuit can be coupled with the common electrode.

The voltage control circuit can include a first voltage control circuit configured to supply a voltage into the common electrode; and a second voltage control circuit configured to supply a voltage to the plurality of individual electrodes.

The first voltage control circuit can include a second switch configured to supply a ground voltage to the common electrode.

The second voltage can be the ground voltage.

The capacitance measuring circuit can deliver the information into the voltage control circuit, and the voltage control circuit can control the driving voltage based on the information.

The information obtained by the capacitance measuring circuit can be a voltage or capacitance.

The common electrode can be floating during a period when the first switch is turned on.

The device can further include a third switch located between the voltage control circuit and the first switch and between the voltage control circuit and the liquid lens, wherein the third switch is turned on when a voltage is supplied to the common electrode, and turned off when the capacitance measuring circuit measures the capacitance.

In accordance with another embodiment, a camera module can include a lens assembly including a liquid lens, which can include a common electrode and a plurality of individual electrodes and at least one solid lens located above or below the liquid lens; a voltage control circuit configured to supply a driving voltage into the liquid lens such that it controls an interface in the liquid lens; a capacitance measuring circuit configured to obtain capacitance between the common electrode and the plurality of individual electrodes in the liquid lens; a first switch located between the capacitance measuring circuit and the liquid lens; and an image sensor located below the lens assembly, wherein one side of the first switch is electrically coupled with the liquid lens and the voltage control circuit. The liquid lens can include: a first plate including a cavity where a conductive liquid and a non-conductive liquid are located; a second plate located above the first plate; and a third plate located below the first plate, wherein the common electrode is located on the first plate, and the plurality of individual electrodes are located underneath the first plate, wherein the capacitance includes plural capacitance sequentially obtained between the common electrode and each individual electrode of the plurality of individual electrodes.

The plurality of individual electrodes can include four individual electrodes respectively located at four corners of the first plate, the capacitance measuring circuit can be capable of measuring the capacitance between the common electrode and each of the four individual electrodes, and the driving voltage can be controlled in response to the capacitance, which is obtained by the capacitance measuring circuit and fed back into the voltage control circuit so that a focal distance of the lens assembly is adjusted.

In accordance with another embodiment, a method for controlling a liquid lens can include supplying a ground voltage into a common electrode of the liquid lens and a voltage into one individual electrode of plurality of individual electrodes in the liquid lens to accumulate electric charge between the common electrode and at least one individual electrode of the plurality of individual electrodes; floating the common electrode of the liquid lens; turning on a first switch located between the liquid lens and a capacitance measuring circuit; measuring a voltage between both sides of a reference capacitance in the capacitance measuring circuit; measuring capacitance between the common electrode and the at least one individual electrode of the plurality of individual electrodes by using the voltage between the both sides of the reference capacitance; and feeding back the capacitance measured by the capacitance measuring circuit to a voltage control circuit to control a driving voltage based on the capacitance, wherein the capacitance includes a plurality of capacitances sequentially obtained between the common electrode and each of the plurality individual electrodes.

The method can further include, after the first switch is turned on, and before the voltage between the both sides of the reference capacitance is measured, moving at least part of the electric charge accumulated between the common electrode and the one individual electrode of the plurality of individual electrodes to the reference capacitor.

In accordance with another embodiment, a device for controlling a liquid lens can include a liquid lens including a common electrode and a plurality of individual electrodes; a voltage control circuit configured to supply a driving voltage into the liquid lens such that it controls an interface in the liquid lens; a capacitance measuring circuit configured to measure capacitance between the common electrode and the plurality of individual electrodes in the liquid lens; and a first switch located between the capacitance measuring circuit and the liquid lens, wherein one side of the first switch is electrically coupled with the liquid lens and the voltage control circuit, the capacitance measuring circuit is capable of measuring the capacitance between the common electrode and each individual electrode of the plurality of individual electrodes and feeding back the capacitance to the voltage control circuit so that the voltage control circuit is configured to control the driving voltage based at least on the capacitance.

Aspects described above are merely some of the embodiments, and various embodiments in which technical features of the disclosure are reflected may be derived and understood based on the following detailed description of the embodiments by those skilled in the art.

Advantageous Effects

Effects of a device according to embodiments will be described as follows.

Embodiments of the subject invention provide methods and devices that ensure more accurate measurement of the movement and variation in the boundary interface in a liquid lens.

In addition, according to the embodiments, the movement and shape of the boundary interface in the liquid lens may be accurately measured, whereby more efficient optical stabilization may be performed on an image acquired by converting optical signals transferred through the liquid lens.

In addition, according to the embodiments, by recognizing the movement and shape of the boundary interface in the liquid lens, the quality of an image acquired via a camera module or an optical device including a lens assembly which includes a liquid lens and a solid lens, may be enhanced.

The effects acquired by the embodiments are not limited to the effects mentioned above, and other unmentioned effects will be clearly understood by those skilled in the art from the following description.

DESCRIPTION OF DRAWINGS

The accompanying drawings, which are included to provide a further understanding of the disclosure, illustrate embodiments and together with the description serve to explain the principle of the embodiments.

In the drawings:

FIGS. 5(a) through 5(c) show examples of variation in the boundary interface inside the liquid lens;

FIG. 6 shows an exemplary control circuit, which is engaged with the liquid lens;

FIGS. 15(a) through 15(c) show examples of variation in the boundary interface inside the liquid lens;

FIGS. 16(a) and 16(b) show an exemplary electrode structure of the liquid lens;

BEST MODE

Figure 1:
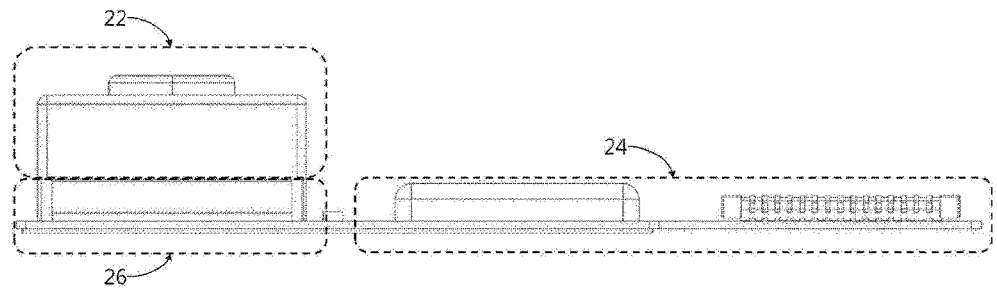
FIG. 1 shows an exemplary camera module.

Hereinafter, exemplary embodiments will be described in detail with reference to the accompanying drawings. The embodiments may be modified in various ways and may have various forms, and specific embodiments will be illustrated in the drawings and will be described in detail herein. However, this is not intended to limit the embodiments to the specific embodiments, and the embodiment should be understood as including all modifications, equivalents, and replacements that fall within the sprit and technical scope of the embodiments.

Although the terms "first" and "second" and the like may be used to describe various elements, the embodiments should not be limited by the terms. These terms are used for distinguishing between similar elements. In addition, terms, which are specially defined in consideration of the configurations and operations of the embodiments, are given only to explain the embodiments, and do not limit the scope of the embodiments.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

FIG. 1 shows an exemplary camera module.

Referring to FIG. 1, a camera module may include a lens assembly 22 and an image sensor 26. The lens assembly 22 may include at least one solid lens disposed in the upper or lower region thereof. The lens assembly 22 may further include a liquid lens, the focal length of which is adjusted using a voltage applied thereto. Specifically, the camera module may include the lens assembly 22, which includes a plurality of lenses including a first lens, the focal length of which is adjusted using a drive voltage that is applied between a common terminal and a plurality of individual terminals, a control circuit 24, which supplies the drive voltage to the first lens, and the image sensor 26, which is disposed below the lens assembly 22 so as to be aligned with the lens assembly 22 and converts light transferred through the lens assembly 22 into electrical signals.

Referring still to FIG. 1, although the camera module may include the circuit 24, the image sensor 26, and the lens assembly 22 including the multiple lenses, which are formed on a single printed circuit board (PCB), this is merely given by way of example, and the scope of the disclosure is not limited thereto. The configuration of the control circuit 24 may be designed in different ways according to the specifications required in the camera module. In particular, when the magnitude of a voltage applied to a liquid lens 28 is reduced, the control circuit 24 may be implemented in a single chip. Thereby, the size of the camera module, which will be mounted in a portable device, may be further reduced.

Figure 2:
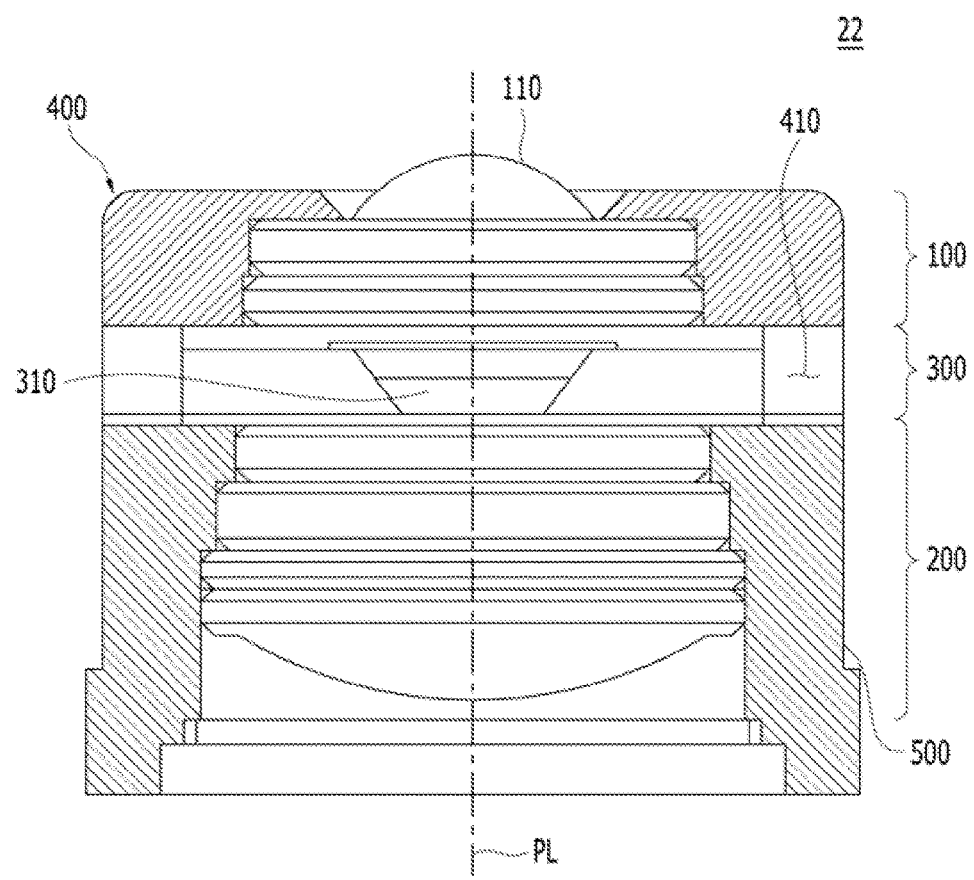
FIG. 2 shows an exemplary lens assembly included in the camera module.

FIG. 2 shows an example of the lens assembly 22 included in the camera module.

As shown in FIG. 2, the lens assembly 22 may include a first lens unit 100, a second lens unit 200, a liquid lens unit 300, a lens holder 400, and a connecting unit 500. The connecting unit 500 may electrically connect an image sensor and a liquid lens to each other, and may include, for example, a substrate, a wire, or an electrical line, which will be described later. The illustrated structure of the lens assembly 22 is merely given by way of example, and the structure of the lens assembly 22 may be changed according to the specifications required in the camera module. For example, the liquid lens unit 300 is located between the first lens unit 100 and the second lens unit 200. However, in another example, the liquid lens unit 300 may be located on the top (the front surface) of the first lens unit 100, and one of the first lens unit 100 and the second lens unit 200 may be omitted. The configuration of the control circuit 24 may be designed in different ways according to the specifications required in the camera module. In particular, when the magnitude of an operating voltage applied to the lens assembly 22 is reduced, the control circuit 24 may be implemented in a single chip. Thereby, the size of the camera module, which could be mounted in a portable device, may be further reduced.

Referring to FIG. 2, the first lens unit 100 is disposed on the front side of the lens assembly 22 and receives light from outside the lens assembly 22. The first lens unit 100 may include at least one lens, or may include two or more lenses aligned along a center axis PL so as to embody in an optical system.

The first lens unit 100 and the second lens unit 200 may be mounted on the lens holder 400. Here, the lens holder 400 may have a through-hole, and the first lens unit 100 and the second lens unit 200 may be disposed in the through-hole. In addition, the liquid lens unit 300 may be inserted into the space between the first lens unit 100 and the second lens unit 200, which are disposed in the lens holder 400.

Meanwhile, the first lens unit 100 may include a solid lens 110. The solid lens 110 may protrude outward from the lens holder 400 so as to be exposed to the outside. When the solid lens 110 is exposed to the outside, the surface of the solid lens 110 may be damaged. Such damage to the lens surface may cause deterioration in the quality of an image photographed by the camera module. In order to inhibit or suppress damage to the surface of the solid lens 110, a glass cover may be disposed, or a coating layer may be formed. Alternatively, the solid lens 110, which is exposed to the outside, may be formed of a wear-resistant material having high rigidity, as compared with a solid lens, which is disposed inside the lens holder in order to inhibit damage to the surface thereof.

The second lens unit 200 may be disposed at the back of the first lens unit 100 and the liquid lens unit 300, and the light introduced from the outside into the first lens unit 100 may be introduced into the second lens unit 200 by passing through the liquid lens unit 300. The second lens unit 200 may be spaced apart from the first lens unit 100 and disposed in the through-hole formed in the lens holder 400.

Meanwhile, the second lens unit 200 may include at least one lens, or may include two or more lenses aligned along the center axis PL so as to embody in an optical system.

The liquid lens unit 300 may be disposed between the first lens unit 100 and the second lens unit 200 and may be inserted into an insertion opening 410 in the lens holder 400. The insertion opening 410 may be formed by opening a portion of the side surface of the lens holder 400. That is, the liquid lens may be inserted through the insertion opening 410 in the side surface of the lens holder 400 to thereby be disposed inside the lens holder 400. The liquid lens unit 300 may also be aligned about the center axis PL in the same manner as the first lens unit 100 and the second lens unit 200. One insertion opening may be provided in the holder 400, or two insertion openings may be provided in the holder 400 so as to face each other (e.g., to face each other in a first direction perpendicular to the center axis PL). At least a portion of the liquid lens may be disposed in the insertion opening, and at least a portion of the liquid lens may protrude outward from the holder 400 through the insertion opening.

The liquid lens unit 300 may include a lens area 310. The light that has passed through the first lens unit 100 may pass through the lens area 310, and liquids may be accommodated in at least a portion of the lens area 310. For example, two types of liquids, i.e. a conductive liquid and a non-conductive liquid may be accommodated in the lens area 310, and the conductive liquid and the non-conductive liquid may disposed so as to not be mixed with each other, but may form a boundary therebetween. The boundary between the conductive liquid and the non-conductive liquid may be deformed by a drive voltage applied through the connecting unit 500, whereby the curvature of an interface in the liquid lens 28 or the focal length of the liquid lens 28 may be changed. When the change in the deformation of the boundary or the curvature of the boundary interface is controlled, the liquid lens unit 300 and the camera module having the same may perform, for example, auto-focusing and anti-handshaking functions.

Figure 3:
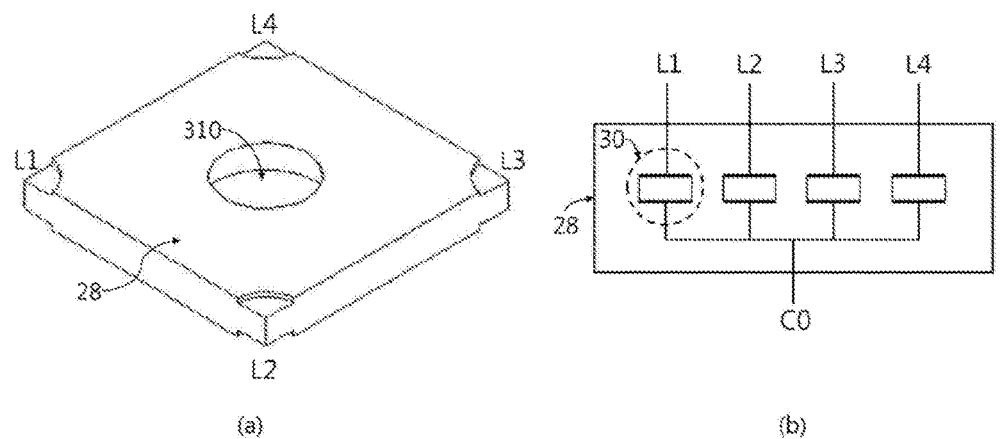
FIG. 3 shows an exemplary liquid lens, the focal length of which is adjusted using a drive voltage.

FIG. 3 shows a liquid lens, the focal length of which is adjusted using a drive voltage. Specifically, in FIG. 3, (a) shows the liquid lens 28 included in the lens assembly 22 (see FIG. 2), and (b) shows a schematic equivalent circuit for explaining the operation of the liquid lens 28.

First, referring to (a) of FIG. 3, the liquid lens 28, the focal length of which is adjusted using a drive voltage, may receive voltages via a plurality of (e.g., four) different individual terminals L1, L2, L3, L4. Specifically, the liquid lens 28 may receive a voltage via the individual terminals L1, L2, L3, L4, which are disposed in four different locations at the same angular distance therebetween. The four individual terminals included in the liquid lens may be disposed at the same angular distance therebetween about the center axis of the liquid lens, and may be disposed respectively at four respective corners of the liquid lens. When the voltage is applied via the individual terminals L1, L2, L3, L4, the boundary between the conductive liquid and the non-conductive liquid accommodated in the lens area 310 may be deformed by the drive voltage, which is created via interaction between the applied voltage and a voltage applied to a common terminal C0, which will be described later.

In addition, referring to (b) of FIG. 3, the lens 28 may receive an operating voltage at one side thereof from the individual different terminals L1, L2, L3, L4, and the other side of the lens 28 may be described as a capacitor 30, which is connected to the common terminal C0. Here, one or a plurality of capacitors 30 included in the equivalent circuit may have a small capacitance (e.g. within a range from about scores of pico-farads (pF) to 200 pF or less). The terminals of the liquid lens described above may also be referred to as electrode sensors or sub-electrodes in this disclosure.

Figure 4:
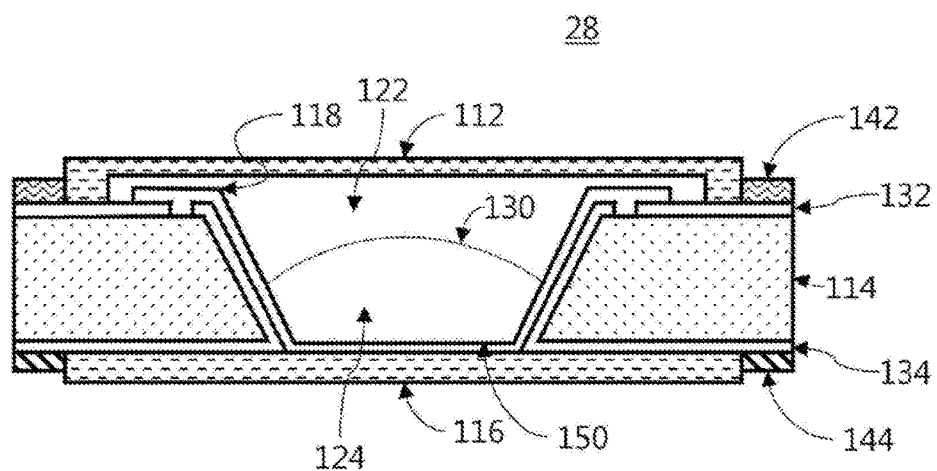
FIG. 4 shows an exemplary liquid lens structure.

FIG. 4 shows a liquid lens structure.

As shown in FIG. 4, the liquid lens 28 may include liquids, a first plate, and electrodes. The liquids 122 and 124 accommodated in the liquid lens 28 may include a conductive liquid and a non-conductive liquid. The first plate 114 may include a cavity 150 or a hole in which the conductive liquid and the non-conductive liquid are accommodated. The cavity 150 may have an inclined surface. The electrodes 132, 134 may be disposed on the first plate 114, and may be disposed on the top of the first plate 114 or the bottom of the first plate 114. The liquid lens 28 may further include a second plate 112, which may be disposed above (below) the electrodes 132, 134. In addition, the liquid lens 28 may further include a third plate 116, which may be disposed below (above) the electrodes 132, 134. As shown, in one embodiment, the liquid lens 28 may include a boundary interface 130 defined by the two different types of liquids 122, 124 (e.g., a conductive liquid and a non-conductive liquid). In addition, one or more substrates 142, 144 may be provided to supply a voltage to the liquid lens 28. The electrodes 132, 134 of the liquid lens 28 and the substrates 142, 144, which supply a voltage to the liquid lens 28, may be coupled to each other via a conductive adhesive (e.g., conductive epoxy) so as to realize electrical conduction therebetween. The corners of the liquid lens 28 may be thinner than the center portion of the liquid lens 28. Although the second plate 112 may be disposed on the upper surface of the liquid lens 28 and the third plate 116 may be disposed on the lower surface of the liquid lens 28, the second plate 112 or the third plate 116 may be omitted from (i.e., not disposed on) a portion of the upper surface or the lower surface of the corners of the liquid lens 28, and therefore the corners of the liquid lens 28 may be thinner than the center portion of the liquid lens 28. The electrodes 132, 134 may be exposed from the upper surface or the lower surface of the corners of the liquid lens. The substrates 142, 144 may be coupled in an electrically conductive manner to the top or bottom of the exposed electrodes 132, 134 via the conductive adhesive.

The liquid lens 28 may include two different types of liquids, for example, the conductive liquid 122 and the non-conductive liquid 124, and the curvature and shape of the boundary interface 130 determined by the two different types of liquids 122, 124 may be adjusted by a drive voltage supplied to the liquid lens 28. The drive voltage supplied to the liquid lens 28 may be transferred via the connecting unit 500. The connecting unit 500 may include at least one of the first substrate 142 and the second substrate 144. When the connecting unit 500 includes both the first substrate 142 and the second substrate 144, the second substrate 144 may transfer a voltage to the respective individual terminals, and the first substrate 142 may transfer a voltage to the common terminal. The number of individual terminals may be four, and the second substrate 144 may transfer a voltage to each of the four individual terminals. The voltages supplied via the second substrate 144 and the first substrate 142 may be applied to the electrodes 132, 134, which are disposed on or exposed from the respective corners of the liquid lens 28.

In addition, the liquid lens 28 may include the first plate 114, which is located between the third plate 116 and the second plate 112, which are formed of a transparent material, the first plate 114 having an opening area having a predetermined inclined surface.

In addition, the liquid lens 28 may include the cavity 150, which is defined by the third plate 116, the second plate 112, and the opening area of the first plate 114. Here, the cavity 150 may be filled with the two different types of liquids 122, 124 (e.g. the conductive liquid and the non-conductive liquid), and the boundary interface 130 may be formed between the two different types of liquids 122, 124. The cavity 150 may have upper and lower openings having different sizes. Specifically, the opening in the cavity 150 that is close to a first electrode disposed on the top of the first plate 114 may be larger than the opening in the cavity 150 that is adjacent to a second electrode disposed on the bottom of the first plate 114. Conversely, the opening in the cavity 150 that is adjacent to the first electrode disposed on the top of the first plate 114 may be smaller than the opening in the cavity 150 that is close to the second electrode disposed on the bottom of the first plate 114. The second electrode may be disposed on the top of the first plate 114 and the first electrode may be disposed on the bottom of the first plate 114, and even in this case, the opening in the cavity that is close to the first electrode may be larger or smaller than the opening in the cavity that is close to the second electrode.

In addition, at least one of the two liquids 122, 124 accommodated in the liquid lens 28 may be conductive, and the liquid lens 28 may include two electrodes 132, 134 respectively disposed on the top and bottom of the first plate 114. The first plate 114 may have an inclined surface and may also include an insulating layer 118 disposed on the inclined surface. The conductive liquid may be in contact with the insulating layer 118. Here, the insulating layer 118 may cover one of the two electrodes 132, 134 (e.g., the second electrode 134), and may cover or expose a portion of the other electrode (e.g., the first electrode 132) so as to allow electricity to be applied to, for example, the conductive liquid 122. Here, the first electrode 132 may include at least one electrode sector (e.g. C0), and the second electrode 134 may include two or more electrode sectors (e.g., L1, L2, L3, L4 in FIG. 4). For example, the second electrode 134 may include a plurality of electrode sectors, which are sequentially disposed in a clockwise direction about the optical axis. The electrode sectors may be referred to as sub-electrodes or terminals of the liquid lens.

Meanwhile, the first electrode 132 in the liquid lens 28 may be understood as a common electrode, and the second electrode 134 may be understood as a plurality of individual electrodes. The first electrode 132 and the second electrode 134 may be disposed at different levels, and the individual electrodes constituting the second electrode 134 may be disposed at the same level as each other.

One substrate or two or more substrates 142, 144 may be connected to transfer a voltage to the two electrodes 132, 134 included in the liquid lens 28. When, for example, the curvature, bending, or slope of the boundary interface 130 formed in the liquid lens 28 is changed using a drive voltage, the focal length of the liquid lens 28 may be adjusted.

FIGS. 5(*a*) through 5(*c*) show variation in a boundary interface inside the liquid lens. Specifically, FIGS. 5(*a*) to 5(*c*) illustrate movement of the boundary interface 30*a*, 30*b*, 30*c*, which may occur when a voltage is applied to the individual electrodes L1, L2, L3, L4 of the liquid lens 28.

First, referring to FIG. 5(*a*), when the same or substantially the same voltage is applied to the individual electrodes L1, L2, L3, L4 of the liquid lens 28, the boundary interface 30*a* may maintain a shape that is close to a circle. When viewed from the top side, the horizontal length LH of the boundary interface 30*a* and the vertical length LV of the boundary interface 30*a* are substantially the same, and the movement (e.g., inclination) of the boundary interface 30*a* may be balanced. In this case, the capacitance values of the boundary interface 30*a* measured via the four different individual electrodes L1, L2, L3 and L4 may be substantially the same.

In addition, referring to FIG. 5(*b*), the case where the voltage applied to the first individual electrode L1 and the third individual electrode L3 of the liquid lens 28 is higher than the voltage applied to the second individual electrode L2 and the fourth individual electrode L4 will be described. In this case, since force of pulling or pushing the boundary interface 30*b* differs between the horizontal direction and the vertical direction, when viewed from the top side, the horizontal length LH of the boundary interface 30*b* may be shorter than the vertical length LV of the boundary interface 30*b*. Since the inclination angle of the boundary interface 30*b* of the liquid lens 28 at the second individual electrode L2 and the fourth individual electrode L4 is smaller than the inclination angle of the boundary interface 30*b* of the liquid lens 28 at the first individual electrode L1 and the third individual electrode L3 when the voltage applied to the second individual electrode L2 and the fourth individual electrode L4 is lower than the voltage applied to the first individual electrode L1 and the third individual electrode L3, the vertical length LV is longer than the horizontal length LH when considered in 3 dimensions, although they seem to be the same in a plan view. In this case, the capacitance values of the boundary interface 30*b* measured via the four different individual electrodes L1, L2, L3 and L4 may be different. Meanwhile, since the boundary interface 30*b* is symmetrically changed in shape, the capacitance values of the boundary interface 30*b* measured via the four different individual electrodes L1, L2, L3, L4 may be symmetrical. In this case, the capacitance values from the individual electrodes L1, L3 may be the same, and the capacitance values from the individual electrodes L2, L4 may be the same.

In addition, referring to FIG. 5(*c*), in the case where the voltage applied to the first individual electrode L1 and the third individual electrode L3 of the liquid lens 28 is different from the voltage applied to the second individual electrode L2 and the fourth individual electrode L4, when viewed from the top side, the vertical length LV of the boundary interface 30*c* may be shorter than the horizontal length LH of the boundary interface 30*c*. In the same manner as in FIG. 5(*b*), the capacitance values of the boundary interface 30*c* measured via the four different individual electrodes L1, L2, L3, L4 may be different. Meanwhile, since the boundary interface 30*c* is symmetrically changed in shape, the capacitance values of the boundary interface 30*c* measured via the four different individual electrodes L1 L2, L3, L4 may be symmetrical. In this case, the capacitance values from the individual electrodes L1, L3 may be the same, and the capacitance values from the individual electrodes L2, L4 may be the same.

In addition, the capacitances measured in the boundary interfaces 30*a*, 30*b*, 30*c* illustrated in FIGS. 5(*a*), 5(*b*), and 5(*c*) may be different, and through the difference in capacitance, movement of the boundary interfaces 30*a*, 30*b*, 30*c* depending on the voltage applied to the first individual electrode L1 to the fourth individual electrode L4 may be more directly and accurately measured.

Meanwhile, although the above-described example describes the structure in which the liquid lens 28 includes four individual electrodes, when the liquid lens 28 includes a greater number of individual electrodes such as eight, twelve, or sixteen individual electrodes and further includes feedback electrodes corresponding thereto, the movement of the liquid lens 28 may be more accurately controlled, and the controlled movement may be monitored more accurately.

FIG. 6 shows a control circuit, which is engaged with the liquid lens.

As shown in FIG. 6, the liquid lens 28 includes a plurality of (e.g., four) individual electrodes L1, L2, L3, L4 and a single common electrode C0 (see FIG. 3). A voltage control circuit 40 may generate and supply voltages $V_{L1}$, $V_{L2}$, $V_{L3}$, $V_{L4}$, $V_{C0}$ to be applied to the four individual electrodes L1, L2, L3, L4 and the single common electrode C0. For example, referring to FIGS. 4 and 5, the four individual electrodes L1, L2, L3, L4 may correspond to the second electrode 134, and the single common electrode C0 may correspond to the first electrode 132. The voltage control circuit 40 may include a first voltage control circuit, which supplies a voltage to the common electrode C0, and a second voltage control circuit, which supplies a voltage to at least one of the individual electrodes L1, L2, L3, L4. The voltage control circuit 40 may include a second switch configured to apply a ground voltage to the common electrode C0.

A capacitance measuring circuit 50 serves to measure or calculate the position, shape, or movement of the boundary interface 30 inside the liquid lens 28. The position, shape, or movement of the boundary interface 30 inside the liquid lens 28 may be measured using capacitance, as described above with reference to FIG. 3. In order to measure the capacitance between the first electrode and the second electrode of the liquid lens 28, at least one individual electrode L1, L2, L3, L4 included in the liquid lens 28 and the common electrode C0 may be used. The individual electrodes L1, L2, L3, L4 may be disposed in compartmental areas at the same level, and the common electrode C0 may be disposed at a level different from that of the individual electrodes L1, L2, L3, L4.

The voltage control circuit 40 may provide the voltages $V_{L1}$, $V_{L2}$, $V_{L3}$, $V_{L4}$, $V_{C0}$ within a range from at least 0V to 80V to the four individual electrodes L1, L2, L3, L4 and the common electrode C0 at the same time or at different times. The voltage control circuit 40 may not apply the voltages to the four individual electrodes L1, L2, L3, L4 and the common electrode C0 at the same time, but may transfer the voltages according to a timing that is generated in the voltage control circuit 40 or by a separate controller (not illustrated).

As shown, the boundary interface 30 inside the liquid lens 28 may be controlled using a drive voltage, which is created by the voltages $V_{L1}$, $V_{L2}$, $V_{L3}$, $V_{L4}$, and $V_{C0}$ transferred to the four individual electrodes L1, L2, L3, L4 and the common electrode C0. Variation in the movement, position, or shape of the boundary interface 30 inside the liquid lens 28 may be caused by the voltage difference between the first to fourth voltages $V_{L1}$, $V_{L2}$, $V_{L3}$, $V_{L4}$ and the voltage $V_{C0}$ applied to the common electrode C0.

When variation in the movement, position, or shape of the boundary interface 30 inside the liquid lens 28 is caused by the voltage difference between the first to fourth voltages $V_{L1}$, $V_{L2}$, $V_{L3}$, $V_{L4}$ and the voltage $V_{C0}$ of the common electrode C0, variation in capacitance may occur. Such variation in capacitance, caused by variation in movement, position, or shape of the boundary interface 30 inside the liquid lens 28, may be within a small range (e.g., within a few pF to scores of pF).

The position or shape of the boundary interface 30 depending on the voltage applied to the first to fourth individual electrodes L1, L2, L3, L4 may be measured by applying a ground voltage GND (0V) to the common electrode C0, and then floating the common electrode C0. More specifically, when the common electrode C0 floats and a falling-edge timing, in which one of the first to fourth voltages $V_{L1}$, $V_{L2}$, $V_{L3}$, $V_{L4}$ applied to the first to fourth individual electrodes L1, L2, L3, L4 falls from a high voltage (e.g. within a range from 10V to 80V) to the ground voltage 0V, or a rising-edge timing, in which one of the first to fourth voltages $V_{L1}$, $V_{L2}$, $V_{L3}$, $V_{L4}$ applied to the first to fourth individual electrodes L1, L2, L3, L4 falls from the ground voltage 0V to a high voltage (e.g. within a range from 10V to 80V), occurs, the capacitance of the boundary interface 30 may be measured using variation in voltage supplied to the corresponding electrode (ground floating edge measurement).

The position or shape of the boundary interface 30 depending on the voltage applied to the first to fourth individual electrodes L1, L2, L3, L4 may be measured by applying a ground voltage GND (0V) to the common electrode C0 to thereby float the common electrode C0. More specifically, when the common electrode C0 floats and a falling-edge phenomenon in which one of the first to fourth voltages $V_{L1}$, $V_{L2}$, $V_{L3}$, and $V_{L4}$ applied to the first to fourth individual electrodes L1, L2, L3, L4 falls from a high voltage (e.g. within a range from 10V to 80V) to the ground voltage 0V or a rising-edge phenomenon occurs, the capacitance of the boundary interface 30 may be measured using variation in voltage applied to opposite ends of a measuring capacitor disposed in the capacitance measuring circuit, which will be described later (ground floating edge measurement).

The capacitance measuring circuit 50, which is connected to the side of the common electrode C0 inside the liquid lens 28, may measure the capacitance between the individual electrodes and the common electrode inside the liquid lens 28. In some embodiments, the capacitance measuring circuit 50 may include various components.

In one example, the capacitance measuring circuit 50, which serves to measure variation in small capacitance (e.g. within a range from a few pF to scores of pF), may not measure any absolute value of capacitance, but may instead measure variation in capacitance via a differential comparison of measuring the capacitance from the magnitude of difference in physical variation that results when one or both of two capacitors, the capacitance values of which are already known, are exposed to the external variation.

In another example, the capacitance measuring circuit 50 may measure the capacitance of the boundary interface 30 by calculating the ratio of a capacitor having an already known large value and a capacitor having a small value to be measured and acquiring the values from the calculated ratio.

The capacitance measuring circuit 50 may transfer the calculated or measured information to the voltage control circuit 40, and the voltage control circuit 40 may adjust the voltages $V_{L1}$, $V_{L2}$, $V_{L3}$, and $V_{L4}$, and $V_{C0}$ based on the information. The information calculated or measured in the capacitance measuring circuit may be a voltage value, a capacitance value, or both. A liquid lens control circuit may be configured such that the capacitance measuring circuit transfers the calculated information to the voltage control circuit and the voltage control circuit adjusts the drive voltage using the calculated information.

Figure 7:
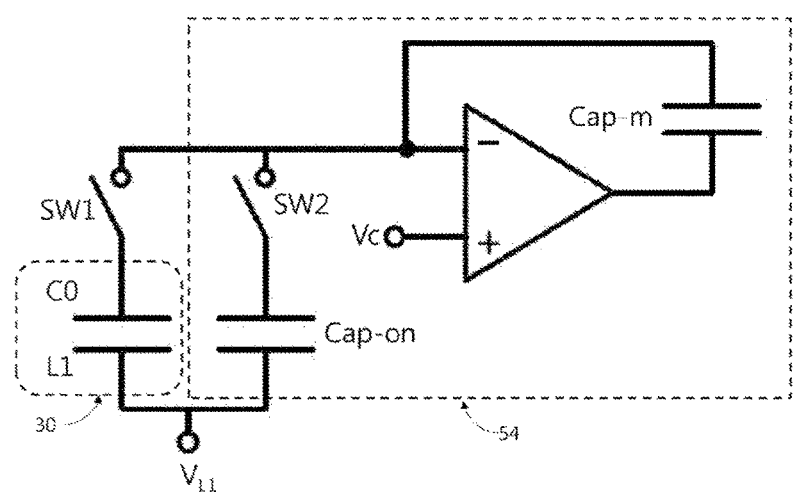
FIG. 7 shows an exemplary capacitance measuring circuit.

FIG. 7 shows an exemplary capacitance measuring circuit. The capacitance measuring circuit illustrated in FIG. 7 is proposed by way of example, and may include various components in some embodiments.

As shown in FIG. 7, when a feedback voltage $V_F$ transferred from a feedback voltage control circuit 52 is applied to one L1 of feedback electrodes disposed in the liquid lens, the capacitance measuring circuit 54 connected to another electrode C0 measures the capacitance between the two electrodes L1, C0, thereby enabling the recognition of the state of the boundary interface 30.

When the voltage $V_{L1}$ is applied and a first switch SW1 in the feedback voltage control circuit 52 is connected, the magnitude of charge Q in the boundary interface 30 may be equal to a value obtained by multiplying variation in voltage $\Delta V_{L1}$ by the capacitance C of the boundary interface 30. When the first switch SW1 is connected, the charge Q may move to a reference capacitor Cap-m.

Thereafter, when the first switch SW1 is turned off and a second switch SW2 is turned on in a falling-edge state in which the voltage $V_{L1}$ falls to a ground voltage, the charge Q, which has moved to the reference capacitor Cap-m, may move to an on-chip capacitor Cap-on. At this time, the magnitude of charge Q moved to the on-chip Cap-on may be equal to a value obtained by multiplying variation in feedback voltage $\Delta V_{L1}$ by the capacitance of the on-chip capacitor Cap-on.

By adjusting the ratio of the number of couplings by the capacitance C of the boundary interface 30 and the number of couplings by the on-chip capacitor Cap-on so that the total magnitude of charge accumulated in the reference capacitor Cap-m becomes zero, the ratio of the two capacitances is calculated from the adjusted ratio. Since the capacitance of the on-chip capacitor Cap-on is a known value, the capacitance C of the boundary interface 30 may be measured.

The configuration of the capacitance measuring circuit 50 or 54 described above may be changed in some embodiments, and an operation and a control method depending on the configuration may be changed. Here, the capacitance measuring circuit 54 may be designed to measure variation in capacitance within a range from a few pF to 200 pF.

The configuration of a circuit that measures capacitance may be implemented in various ways in some embodiments. For example, there may be used a circuit, coupled with a common electrode, which calculates capacitance based on a resonance frequency using LC series resonance. However, when the LC series resonance is used, since it is necessary to apply waveforms for respective frequencies in order to find the resonance frequency, time may be consumed to calculate the capacitance, which may have an effect on the boundary interface inside the liquid lens. However, the capacitance measuring circuit 50, 54 described above is a capacitance measuring circuit using a switched capacitor. The switched capacitor may include two switches and one capacitor, and may serve to control the average current that flows through the two switches. Here, the average resistance may be inversely proportional to the capacity of the capacitor and a switch operating frequency. When the capacitance of the liquid lens is measured using the switched capacitor, the capacitance may be measured at a very fast speed (e.g., scores of ns).

In addition, as compared with an LC series resonance circuit including all of a resistor, an inductor and a capacitor, the switched capacitor circuit, which may include the capacitor and the switches only, may be more integrated, so as to be easily applicable to a mobile appliance, or the like. One end of the first switch may be electrically connected to the liquid lens and the voltage control circuit.

Figure 8:
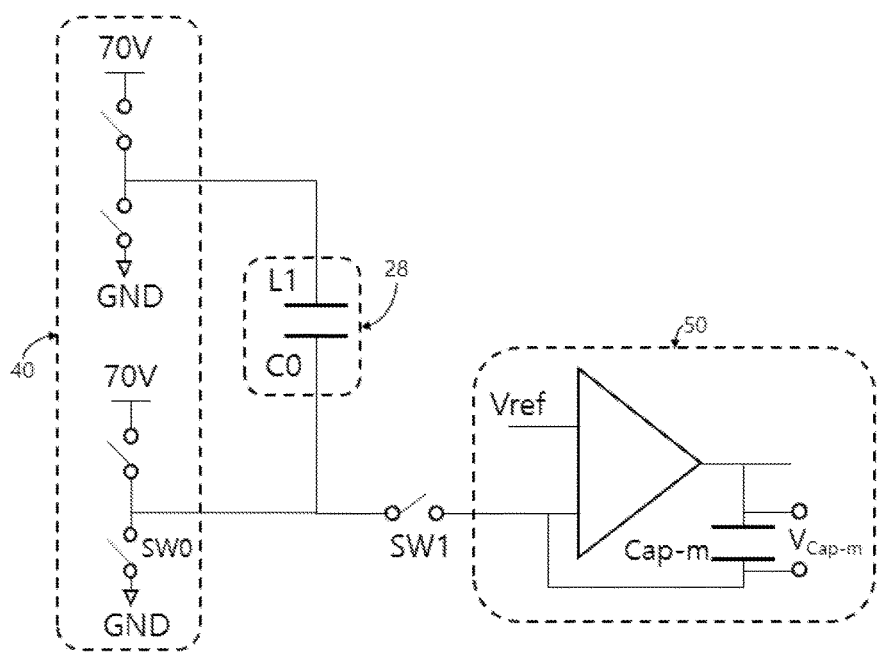
FIG. 8 shows a first example of the control circuit.

FIG. 8 shows a first example of the control circuit. For convenience of description, one L1 of the individual electrodes will be described by way of example.

As shown in FIG. 8, the control circuit may include the voltage control circuit 40 and the capacitance measuring circuit 50, and may be connected to the liquid lens 28. The voltage control circuit 40 may selectively transfer one of a high voltage (e.g., 70V or 35V) and a ground voltage GND (e.g., a reference potential of the control circuit) to the individual electrode L1 and the common electrode C0 included in the liquid lens 28. In this disclosure, the ground voltage GND, which has been described above and also will be described later, may be the reference potential of the control circuit.

The capacitance measuring circuit 50 may be connected to the side of the common electrode C0. Of course, the capacitance measuring circuit 50 may be connected to the side of the individual electrodes. In the case of connection to the side of the individual electrodes, the capacitance measuring circuit 50 may be connected to each of the individual electrodes. When the first switch SW1, which will be described later, is connected to the capacitance measuring circuit 50 in order to measure the capacitance of the liquid lens 28, the magnitude of charge stored in the capacitor of the liquid lens 28 may be transferred to the capacitance measuring circuit 50. The capacitance measuring circuit 50 may further include components such as a capacitor and a comparator, and may measure the magnitude of charge transferred from the capacitor of the liquid lens 28.

The first switch SW1 may be disposed between the capacitance measuring circuit 50 and the liquid lens 28. One side of the first switch SW1 may be connected to the voltage control circuit 40 and/or the common electrode C0 (or the individual electrode L1). Thus, the first switch SW1 may selectively transfer the charge accumulated between the common electrode C0 and at least one L1 of the individual electrodes to the capacitance measuring circuit 50. The charge, transferred to the capacitance measuring circuit 50 via the first switch SW1, may be stored in a reference capacitor disposed in the capacitance measuring circuit 50. By measuring the charge accumulated in the reference capacitor or by measuring a potential difference (voltage) between opposite ends of the reference capacitor caused by the accumulated charge, the position of the boundary interface at opposite ends of the electrode to be measured may be recognized.

When the capacitance measuring circuit 50 is connected to the common electrode C0, a ground voltage GND is applied to the common electrode C0, prior to measuring the capacitance of the liquid lens 28. Then, when the first switch SW1 is connected (turned on), a second switch SW0 of the voltage control circuit 40 is turned off to float the common electrode C0. The second switch SW0 serves to apply the ground voltage GND to the common electrode C0. When the first switch SW1 is connected and the voltage $V_{L1}$ applied to the individual electrode L1 to be measured is changed, the charge Q stored in the capacitor of the liquid lens 28, e.g., $Q=\Delta V_{L1} \times C$, where C is the capacitance in the liquid lens), may move to the capacitance measuring circuit 50.

Figure 9:
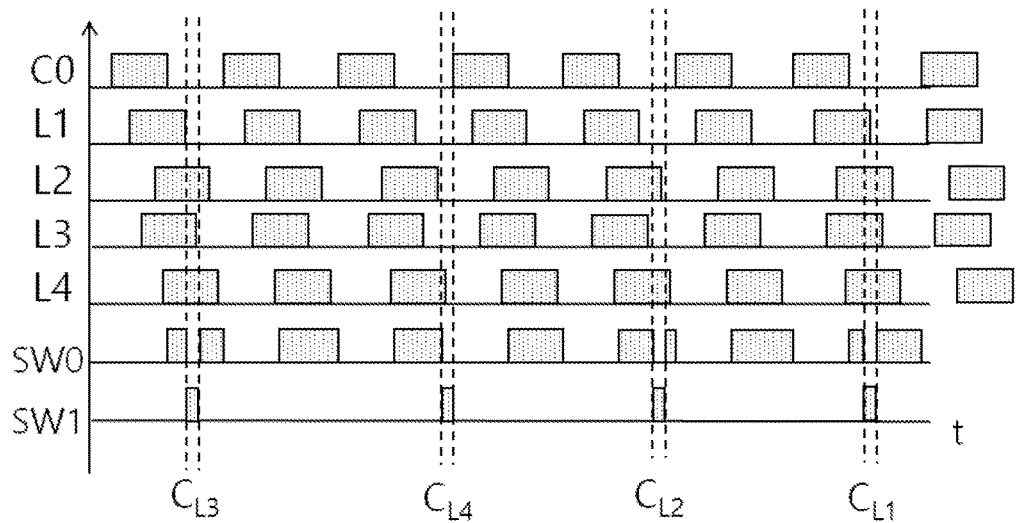
FIG. 9 shows an exemplary operation of the control circuit of FIG. 8.

FIG. 9 shows the operation of the control circuit of FIG. 8.

As shown in FIG. 9, a high voltage (e.g., 70V or 35V) and a ground voltage (e.g., 0V) may be applied to the individual electrodes L1, L2, L3, L4 and the common electrode C0 of the liquid lens at a timing that is controlled by time-sharing control.

After the time at which a ground voltage is applied to the common electrode C0, i.e. the time at which the second switch SW0 of the voltage control circuit 40 is connected, the second switch SW0 is turned off to float the common electrode C0 and the first switch SW1 in the capacitance measuring circuit 50 is connected (turned on). In this state, the capacitance in the liquid lens is measured at the time of falling-edge in which the high voltage applied to the individual electrodes L1, L2, L3, L4 falls to the ground voltage.

The capacitance measuring circuit 50 may be connected to the common electrode C0 or the individual electrode (each electrode sector constituting the individual electrode). For convenience of description, a capacitance measuring method in the case where the capacitance measuring circuit 50 is connected to the common electrode C0 will be described with reference to FIG. 8 and/or FIG. 9. In order to measure the capacitance between the electrode to be measured and the common electrode (the capacitance between the common electrode and each individual electrode may be measured, or the capacitances between the common electrode and a plurality of electrode sectors constituting the individual electrodes may be sequentially measured), a voltage of a high level (i.e. a higher voltage than the ground voltage GND) is applied from the voltage control circuit or the feedback voltage control circuit to an electrode to be measured (e.g., the individual electrode), and the ground voltage is applied from the voltage control circuit or the feedback voltage control circuit to an electrode (e.g., the common electrode) corresponding to the electrode to be measured. When the two requirements described above are satisfied, a charge may be charged or trapped in the electrode to be measured and the common electrode. Thereafter, in the state in which the second switch SW0 is turned off to float the common electrode and the first switch SW1 is turned on, the potential of the electrode to be measured, to which the high-level voltage has been applied from the voltage control circuit or the feedback voltage control circuit, is lowered (e.g. from the high voltage to the ground voltage GND) to distribute the trapped charge to the capacitance measuring circuit. Thereby, the capacitance of the electrode to be measured may be measured. Since the trapped charge may be distributed to the electrode to be measured and to the capacitor inside the capacitance measuring circuit, and the capacitance value of the capacitor inside the capacitance measuring circuit may be predetermined, the capacitance value of the electrode to be measured may be obtained using the magnitude of charge that has been distributed to the capacitance measuring circuit and accumulated on opposite ends of the capacitor.

The falling edge of the voltage $V_{L3}$ applied to the third individual electrode L3 may occur during a section in which the first switch SW1 is connected at first, and thus a third capacitance $C_{L3}$ between the third individual electrode L3 and the common electrode C0 may be measured. Thereafter, by falling the voltage applied to the electrode to be measured during the section in which the first switch SW1 is connected, a fourth capacitance $C_{L4}$ between the fourth individual electrode L4 and the common electrode C0, a second capacitance $C_{L2}$ between the second individual electrode L2 and the common electrode C0, and a first capacitance $C_{L1}$ between the first individual electrode L1 and the common electrode C0 may be sequentially measured. No voltage would be supplied to the common electrode C0 from the voltage control circuit during the section for which the first switch SW1 is turned on. Thus, the common electrode C0 may be placed in a floating state by the voltage control circuit during the section for which the first switch SW1 is turned on.

Meanwhile, for the measurement of the capacitance, the voltage control circuit may rotate the voltage applied to the respective individual electrodes included in the liquid lens in a clockwise direction or in a counterclockwise direction so that the voltage is transferred to the respective individual electrodes at different times.

Figure 10:
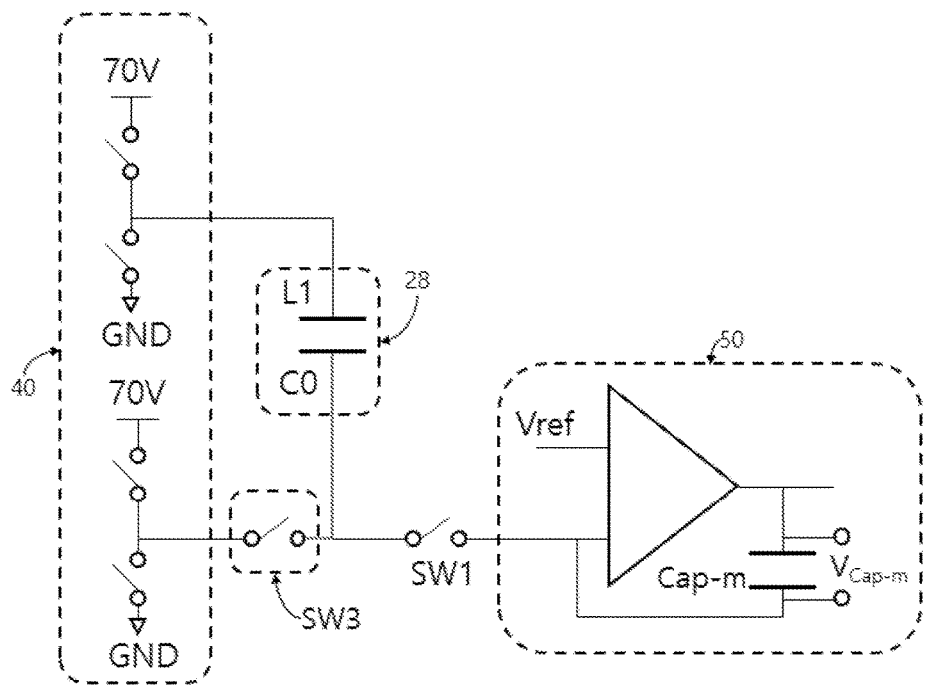
FIG. 10 shows a second example of the control circuit.

FIG. 10 shows a second example of the control circuit. For convenience of description, one L1 of the individual electrodes will be described by way of example but not limitation.

As shown in FIG. 10, the control circuit may include the voltage control circuit 40 and the capacitance measuring circuit 50, and may be connected to the liquid lens 28. The voltage control circuit 40 may selectively transfer one of a high voltage (e.g., 70V or 35V) and a ground voltage GND (e.g., a reference potential of the control circuit) to the individual electrode L1 and the common electrode C0 included in the liquid lens 28.

The capacitance measuring circuit 50 may be connected to the side of the common electrode C0. The capacitance measuring circuit 50 may, conversely, be connected to the side of the individual electrode. When the first switch SW1, which will be described later, is connected to the capacitance measuring circuit 50 in order to measure the capacitance in the liquid lens 28, the magnitude of charge stored in the capacitor of the liquid lens 28 may be transferred to the capacitance measuring circuit 50. The capacitance measuring circuit 50 may further include other components such as a capacitor and a comparator, and may measure the magnitude of charge transferred from the capacitor of the liquid lens 28.

The first switch may be disposed between the capacitance measuring circuit and the liquid lens.

The control circuit may further include a third switch SW3 disposed between the voltage control circuit 40 and the first switch and/or between the voltage control circuit 40 and the liquid lens 28. The third switch SW3 may be connected at one end thereof to the voltage control circuit 40 and at the other end thereof to the liquid lens 28 and/or the first switch SW1. The third switch SW3 may control the floating state in a process in which the capacitance measuring circuit 50 connected to the common electrode C0 measures the capacitance in the liquid lens. In addition, as compared with the control of the floating state using the switch inside the voltage control circuit 40, the independently connected switch SW3 may more effectively reduce the withstand voltage of a switching element.

The third switch SW3 is connected to apply the ground voltage GND to the common electrode C0, prior to measuring the capacitance of the liquid lens 28. Thereafter, the third switch SW3 floats the common electrode C0. By changing the voltage $V_{L1}$ applied to the individual electrode L1 to be measured when the first switch SW1 is connected (turned on), the charge Q stored in the capacitor of the liquid lens 28 (e.g., $Q=\Delta V_{L1} \times C$, where C is the capacitance in the liquid lens) may move to the capacitance measuring circuit 50.

Figure 11:
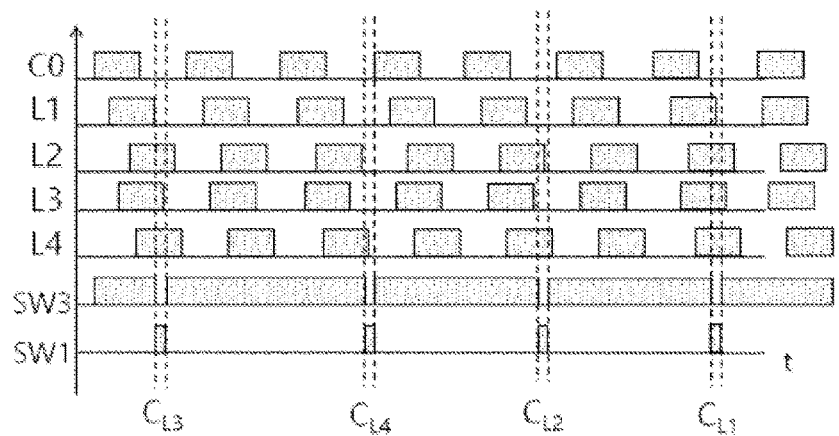
FIG. 11 shows an exemplary operation of the control circuit of FIG. 10.

FIG. 11 shows the operation of the control circuit of FIG. 10.

As shown in FIG. 11, a high voltage (e.g., 70V or 35V) and a ground voltage (e.g., 0V) may be applied to the individual electrodes L1, L2, L3, L4 and the common electrode C0 of the liquid lens at a timing that is controlled by time-sharing control.

The third switch SW3 may be connected to the voltage control circuit 40 to apply a ground voltage to the common electrode C0. After the ground voltage is applied to the common electrode C0 in the connected state of the third switch SW3, the third switch SW3 is turned off to float the common electrode C0. In the floating state of the common electrode C0, the first switch SW1 in the capacitance measuring circuit 50 is connected (turned on). In this state, charge movement may occur when a falling-edge phenomenon in which the high voltage applied to the individual electrodes L1, L2, L3, L4 falls to the ground voltage occurs.

When the falling edge of the voltage $V_{L3}$ applied to the third individual electrode L3 may occur at the time at which the first switch SW1 is connected at first, a third capacitance $C_{L3}$ between the third individual electrode L3 and the common electrode C0 may be measured. Thereafter, at the time at which the first switch SW1 is connected, a fourth capacitance $C_{L4}$ between the fourth individual electrode L4 and the common electrode C0, a second capacitance $C_{L2}$ between the second individual electrode L2 and the common electrode C0, and a first capacitance $C_{L1}$ between the first individual electrode L1 and the common electrode C0 may be sequentially measured.

In some embodiments, the liquid lens may include a greater number of individual electrodes than eight individual electrodes. However, the number of individual electrodes needs to be a multiple of 4. In addition, the number of feedback electrodes disposed in the liquid lens may be the same as or different from the number of individual electrodes included in the liquid lens.

Figure 12:
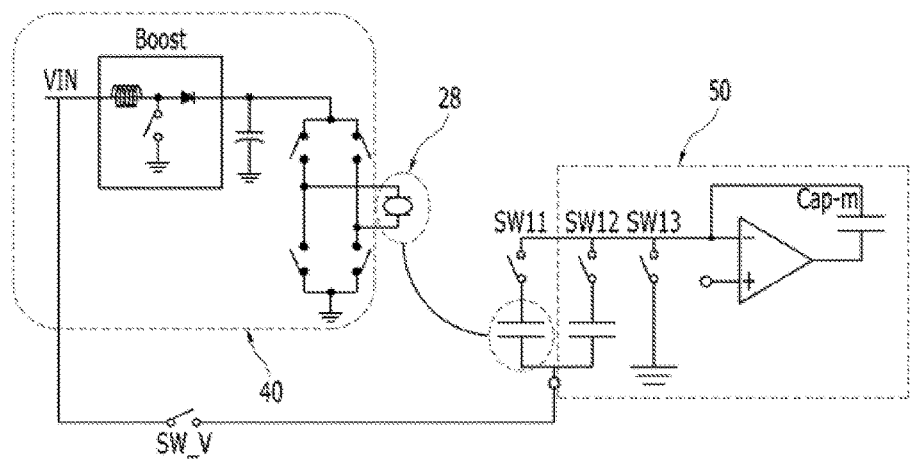
FIG. 12 shows an example of connection between the liquid lens and the control circuit.

FIG. 12 shows connection between the liquid lens and the control circuit. In particular, FIG. 12 shows an embodiment of the control circuit connection described with reference to FIG. 6.

As shown in FIG. 12, the liquid lens 28 may be connected to the voltage control circuit 40, which supplies voltages to each individual electrode and the common electrode of the liquid lens 28, and the capacitance measuring circuit 50 may be connected to one of the individual electrode and the common electrode of the liquid lens 28. The two electrodes, which are located at positions at which the capacitance in the liquid lens 28 is to be measured, i.e. located at opposite sides of the capacitance measurement location, may be selected as described above with reference to FIGS. 8 to 11.

Meanwhile, the voltage control circuit 40 and the capacitance measuring circuit 50 are connected to each other via a switching element SW_V. The switching element SW_V is turned on at the time at which the capacitance in the liquid lens 28 is to be measured so that an input voltage VIN before boosting in the voltage control circuit 40 may be transferred to the capacitance measuring circuit 50.

Figure 13:
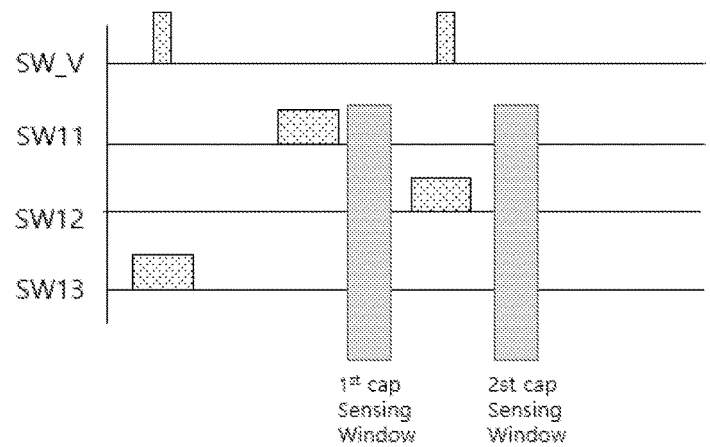
FIG. 13 shows an example of the timing of switching elements illustrated in FIG. 12 in order to measure the capacitance in the liquid lens.

FIG. 13 shows the timing of switching elements illustrated in FIG. 12 in order to measure the capacitance in the liquid lens. A detailed operation of the capacitance measuring circuit 50 has already been described above. Here, the description will be centered on the operating time of the switching circuit described above with reference to FIG. 12.

As shown in FIG. 13, in order to apply the voltage VIN required to measure the capacitance in the liquid lens, the switching element SW_V is turned on. In addition, a fourth switch SW13 is turned on to apply a ground voltage to the reference capacitor Cap-m in the capacitance measuring circuit 50 so as to discharge the charge.

Thereafter, when a fifth switch SW11 is connected, the charge accumulated due to the capacitance in the liquid lens moves to the reference capacitor Cap-m. After the fifth switch SW11 is turned off, a first capacitance value in the reference capacitor Cap-m may be sensed (first cap sensing window).

Thereafter, the switching element SW_V is turned on to apply the voltage VIN, and a sixth switch SW12 is turned on. At this time, the charge accumulated in the reference capacitor Cap-m may move. Thereafter, in a state in which the switching element SW_V and the sixth switch SW12 are turned off, a second capacitance value in the reference capacitor Cap-m may be sensed (second cap sensing window).

Thereafter, a method of recognizing the capacitance in the liquid lens may be identical to the description with reference to FIG. 7.

The capacitance in the liquid lens, which is calculated or measured by the capacitance measuring circuit, may be transferred to the voltage control circuit. The voltage control circuit, which has received the capacitance in the liquid lens, may recognize the shape or state of the boundary interface in the liquid lens from the capacitance. When the shape or state of the boundary interface in the liquid lens differs from a target shape or value, the voltage control circuit may adjust the drive voltage.

As described above, a method of controlling the liquid lens may include a step of accumulating a charge between the common electrode and the individual electrode by connecting the common electrode of the liquid lens to a ground and applying a voltage to the individual electrode of the liquid lens, a step of turning on the first switch disposed between the capacitance measuring circuit and the liquid lens, and a step of measuring a voltage at opposite ends of the reference capacitor of the capacitance measuring circuit. Thereafter, the capacitance between the common electrode and the individual electrode may be calculated using the measured voltage value at opposite ends of the reference capacitor.

In some embodiments, a method of controlling the liquid lens may include a step of connecting one of the individual electrode and the common electrode of the liquid lens to a ground, a step of applying a voltage to the other one of the individual electrode and the common electrode of the liquid lens, a step of accumulating a charge between the common electrode and the individual electrode, a step of turning on the first switch, a step of measuring a voltage at opposite ends of the reference capacitor of the capacitance measuring circuit, and a step of calculating the capacitance between the common electrode and the individual electrode using the measured voltage value at opposite ends of the reference capacitor.

Figure 14:
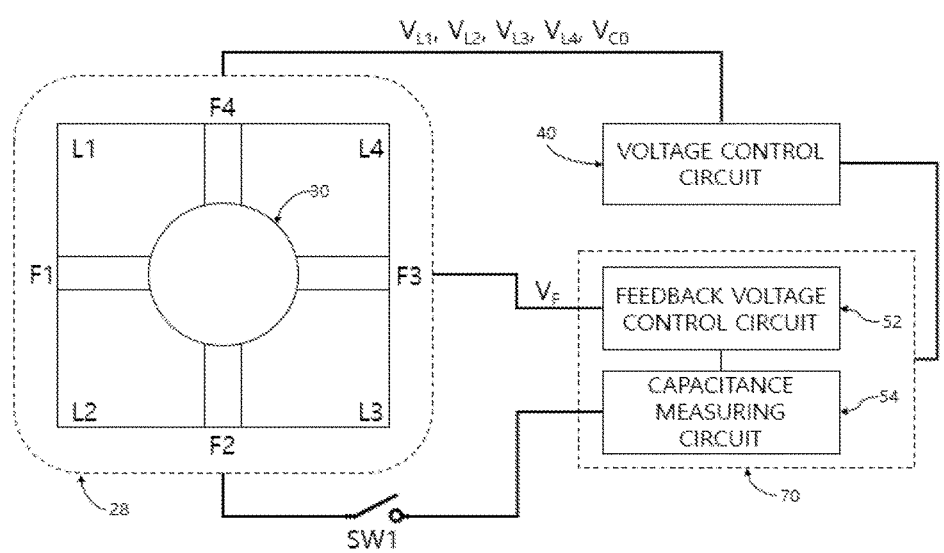
FIG. 14 shows an exemplary feedback circuit, which is engaged with the liquid lens.

FIG. 14 shows a feedback circuit, which is engaged with the liquid lens.

Referring to FIG. 14, individual electrodes and feedback electrodes, which are disposed on the lower surface or the upper surface of the first plate in which the cavity is formed, are illustrated. The liquid lens may include a common electrode, a first feedback electrode, a plurality of individual electrodes, and a second feedback electrode. The capacitance measuring circuit may calculate the capacitance between the first feedback electrode and the second feedback electrode. The second feedback electrode may be disposed between the individual electrodes, and the first feedback electrode may be disposed at a position corresponding to the second feedback electrode. The first feedback electrode may be disposed close to a first electrode, and the second feedback electrode may be disposed between a plurality of second electrodes. A connecting unit may include a first substrate and a second substrate, the first substrate may transfer a voltage to the first feedback electrode, and the second substrate may transfer a voltage to the second electrode or may transfer a feedback voltage to the second feedback electrode. The first electrode may be the common electrode, and the second electrodes may be the individual electrodes. The number of second feedback electrodes may be the same as the number of second electrodes. An insulating layer may be provided in the cavity in the liquid lens so as to cover the second electrodes and the second feedback electrodes. The capacitance measuring circuit may calculate the capacitance between two first feedback electrodes among a plurality of first feedback electrodes of the liquid lens. The first feedback electrodes may be disposed between the individual electrodes. The first feedback electrodes may be disposed close to the common electrode.

As shown in FIG. 14, the liquid lens 28 can include four individual electrodes L1, L2, L3, L4 and one common electrode C0 (not illustrated). The voltage control circuit 40 may generate and supply drive voltages $V_{L1}$, $V_{L2}$, $V_{L3}$, $V_{L4}$, $V_{C0}$ to be applied to the four individual electrodes L1, L2, L3, L4 and the single common electrode C0. For example, referring to FIGS. 4 and 14, the four individual electrodes L1, L2, L3, L4 may correspond to the second electrode 134, and the single common electrode C0 may correspond to the first electrode 132.

A feedback circuit 70 serves to measure the movement of the boundary interface 30 inside the liquid lens 28. The capacitance of the boundary interface 30 inside the liquid lens 28 may be understood and measured as described above with reference to FIG. 3. In order to measure variation in the capacitance of the boundary interface 30 inside the liquid lens 28, one or more feedback electrodes F1, F2 F3 F4 included in the liquid lens 28 may be used. Although the feedback circuit 70 in FIG. 14 includes the feedback voltage control circuit 52 and the capacitance measuring circuit 54, in another embodiment, the liquid lens may include no feedback electrode, and the feedback circuit 70 may include only the capacitance measuring circuit without the feedback voltage control circuit.

The feedback circuit 70 may include the feedback voltage control circuit 52 and the capacitance measuring circuit 54. The feedback voltage control circuit 52 may transfer a feedback voltage to any one feedback electrode among the first feedback electrode and the second feedback electrode in order to measure the capacitance between the first feedback electrode and the second feedback electrode. The feedback voltage control circuit 52 outputs a feedback voltage $V_F$ for the measurement of the capacitance to the feedback electrodes F1, F2, F3, F4. Since the voltages $V_{L1}$, $V_{L2}$, $V_{L3}$, $V_{L4}$, $V_{C0}$ output to the voltage control circuit 40 are high voltages within a range from at least 10V to 80V, they may not be suitable for measuring the capacitance of the boundary interface 30 within a very small range from about scores of pF to 200 pF. Therefore, the feedback voltage control circuit 52 may supply the feedback voltage $V_F$, which may be within a low-level range from about 1.5V to 5V, to the feedback electrodes F1, F2, F3, F4. The feedback voltage may range from 1.5 to 5V, and the voltage supplied to the liquid lens may range from 10V to 80V.

The feedback circuit 70 may transfer a feedback voltage to any one feedback electrode among two different feedback electrodes in order to measure the capacitance between the two different feedback electrodes. The two different feedback electrodes may be included in the liquid lens. The liquid lens may include the first plate having the cavity in which the conductive liquid and the non-conductive liquid are accommodated, the common electrode and the first feedback electrode disposed on the top of the first plate, and the second feedback electrode and the plurality of individual electrodes disposed on the bottom of the first plate.

When the feedback voltage $V_F$ is applied to one side of the liquid lens 28, the capacitance measuring circuit 54 connected to the other side may measure the capacitance between one side and the other side of the liquid lens 28. In some embodiments, the capacitance measuring circuit 54 may include various components. Variation in capacitance, which is caused by movement and variation of the boundary interface 30 in the liquid lens 28 may be within a small range from a few pF to scores of pF.

In one example, the capacitance measuring circuit 54, which serves to measure variation in capacitance within a small range from a few pF to scores of pF, may not measure any absolute value of capacitance, but may measure variation in capacitance via differential comparison of measuring the capacitance from the magnitude of difference in physical variation between two capacitors having known capacitance values when one or two of the capacitors are exposed to the exterior variation.

In another example, the capacitance measuring circuit 54, which serves to measure variation in capacitance within a small range from a few pF to scores of pF, may measure the capacitance of the boundary interface 30 by calculating the ratio of a capacitor having an already known large capacitance value and a capacitor having a small capacitance value to be measured and acquiring the values from the calculated ratio.

The feedback circuit 70 may transfer the calculated or measured information to the voltage control circuit 40, and the voltage control circuit 40 may adjust the voltage according to the information. The information calculated or measured in the feedback circuit 70 may be a voltage or capacitance value.

The capacitance measuring circuit 54 may transfer the calculated information to the voltage control circuit 40, and the voltage control circuit 40 may adjust the drive voltage according to the calculated information. Here, the calculated information may be a voltage or capacitance value.

FIGS. 15(a) to 15(c) show variation in the boundary interface inside the liquid lens. Specifically, FIGS. 15(a) to 15(c) illustrate movement of the boundary interface 30a, 30b, 30c, which may occur when a drive voltage is applied to the individual electrodes L1, L2, L3, L4 of the liquid lens 28.

First, referring to FIG. 15(a), when substantially the same voltage is applied to the individual electrodes L1, L2, L3, L4 of the liquid lens 28, the boundary interface 30a may maintain a shape that is close to a circle. When viewed from the top side, the horizontal length LH of the boundary interface 30a and the vertical length LV of the boundary interface 30a are substantially the same, and the movement (e.g., inclination) of the boundary interface 30a may be balanced. In this case, the capacitance values of the boundary interface 30a measured via the four different individual electrodes L1, L2, L3, L4 may be substantially the same.

In addition, referring to FIG. 15(b), the case where the voltage applied to the first individual electrode L1 and the third individual electrode L3 of the liquid lens 28 is higher than the voltage applied to the second individual electrode L2 and the fourth individual electrode L4 will be described. In this case, since force of pulling or pushing the boundary interface 30b differs between the horizontal direction and the vertical direction, when viewed from the top side, the horizontal length LH of the boundary interface 30b may be shorter than the vertical length LV of the boundary interface 30b. Since the inclination angle of the boundary interface 30b of the liquid lens 28 at the second individual electrode L2 and the fourth individual electrode L4 is smaller than the inclination angle of the boundary interface 30b of the liquid lens 28 at the first individual electrode L1 and the third individual electrode L3 when the voltage applied to the second individual electrode L2 and the fourth individual electrode L4 is lower than the voltage applied to the first individual electrode L1 and the third individual electrode L3, the vertical length LV is longer than the horizontal length LH when considered in 3 dimensions, although they seem to be the same in a plan view. In this case, the capacitance values of the boundary interface 30b measured via the four different individual electrodes L1, L2, L3, L4 may be different. Meanwhile, since the boundary interface 30b is symmetrically changed in shape, the capacitance values of the boundary interface 30b measured via the four different individual electrodes L1, L2, L3, L4 may be symmetrical. In this case, the capacitance values from the individual electrodes L1, L3 may be the same, and the capacitance values from the individual electrodes L2, L4 may be the same.

In addition, referring to FIG. 15(c), in the case where the voltage applied to the first individual electrode L1 and the third individual electrode L3 of the liquid lens 28 is different from the voltage applied to the second individual electrode L2 and the fourth individual electrode L4, when viewed from the top side, the vertical length LV of the boundary interface 30c may be shorter than the horizontal length LH of the boundary interface 30c. In the same manner as in FIG. 15(b), the capacitance values of the boundary interface 30c measured via the four different individual electrodes L1, L2, L3, L4 may be different. Meanwhile, since the boundary interface 30c is symmetrically changed in shape, the capacitance values of the boundary interface 30c measured via the four different individual electrodes L1, L2, L3, L4 may be symmetrical. In this case, the capacitance values from the individual electrodes L1, L3 may be the same, and the capacitance values from the individual electrodes L2, L4 may be the same.

In addition, the capacitances measured in the boundary interfaces 30a, 30b and 30c illustrated in FIGS. 15(a), 15(b), and 15(c) may be different, and through the difference in capacitance, movement of the boundary interfaces 30a, 30b, 30c depending on the voltage applied to the first individual electrode L1 to the fourth individual electrode L4 may be more directly and accurately measured.

Meanwhile, although the above-described example describes the structure in which the liquid lens 28 includes four individual electrodes, when the liquid lens 28 includes a greater number of individual electrodes such as, for example, eight, twelve, or sixteen individual electrodes and further includes feedback electrodes corresponding thereto, the movement of the liquid lens 28 may be more precisely controlled, and the controlled movement may be more accurately measured.

FIGS. 16(a) and 16(b) show an electrode structure of the liquid lens. FIGS. 16(a) and 16(b) show an individual electrode or a common electrode disposed on the upper surface or the lower surface of the cavity in which liquids are accommodated. Specifically, FIG. 16(a) shows the arrangement of electrodes on opposite sides (the top and the bottom) of the liquid lens 28 (see FIG. 3), and FIG. 16(b) shows a method of measuring the capacitance between the electrodes disposed at opposite sides of the liquid lens.

First, referring to FIG. 16(a), four individual electrodes L1, L2, L3, L4 for supplying a voltage are provided around the cavity on one side of the liquid lens. In addition, one or more feedback electrodes F1a, F2a, F3a, F4a are provided between the four individual electrodes L1, L2, L3, L4 on one side of the liquid lens. In some embodiments, the liquid lens may include only one feedback electrode F1. In addition, the number of individual electrodes may differ from the number of feedback electrodes. However, feedback electrodes need to be disposed respectively at four corners so as to have the same angular distance therebetween against the cavity, i.e., so as to be radially symmetrical, in order to facilitate more accurate measurement of the movement and shape of the boundary interface 30.

Similar to those on one side of the liquid lens, one or more feedback electrodes F1b, F2b, F3b, F4b may also be provided on the other side of the liquid lens on which the common electrode C0 is disposed. The feedback electrodes F1b, F2b, F3b, F4b provided on the other side of the liquid lens may correspond to the feedback electrodes F1a, F2a, F3a, F4a provided on the one side of the liquid lens. In addition, the number of feedback electrodes F1b, F2b, F3b, F4b provided on the other side of the liquid lens may be the same as the number of feedback electrodes F1a, F2a, F3a, F4a provided on the one side of the liquid lens. In addition, the feedback electrodes may be disposed between the individual electrodes, and no additional feedback electrode may be present near the common electrode. In this case, the movement and shape of the boundary interface may be estimated by measuring the capacitance between the feedback electrodes and the common electrode.

In addition, referring to FIG. 16(b), a method of measuring the capacitance corresponding to the boundary interface 30 in the liquid lens will be described by way of example. As shown in FIG. 16(a), the feedback electrodes F1a, F2a, F3a, F4a, F1b, F2b, F3b, F4b may be disposed on opposite sides of the liquid lens to enable the measurement of capacitance in a desired direction. For example, the capacitance between two feedback electrodes F1a, F2b, which are disposed at corresponding positions on opposite sides of the liquid lens, may be measured. In addition, the capacitance between two feedback electrodes F1a, F2a, which are disposed on one side of the liquid lens, may be measured. In addition, the capacitance between two feedback electrodes F1b. F3b, which are disposed on the other side of the liquid lens, may be measured. This measurement of capacitance may be selectively performed by disposing a switching element between the feedback circuit 70 and the liquid lens 28. The measurement of capacitance in various directions and ways assists in more accurately understanding the characteristics of the boundary interface 30 in the liquid lens (e.g., variation in the position, movement, or shape of the boundary interface depending on the supplied drive voltage). This may assist in lens calibration, which is required to understand the characteristics of the liquid lens and to correct and more accurately control distortion of the liquid lens.

While the liquid lens mounted in a camera module or an optical device is driven, the feedback circuit 70 may measure capacitance, which varies depending on the position, movement or shape of the boundary interface 30. Once the position, movement or shape of the boundary interface 30 has been recognized via the capacitance, the result may be transferred to the voltage control circuit 40 to enable adjustment of the drive voltage when distortion has occurred.

Figure 17:
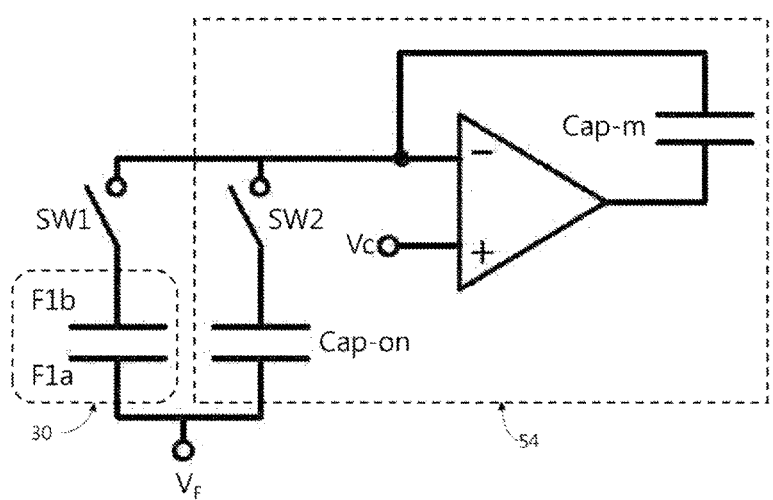
FIG. 17 shows an exemplary capacitance measuring circuit.

FIG. 17 shows an exemplary capacitance measuring circuit. The capacitance measuring circuit illustrated in FIG. 17 is suggested by way of example, and may include various components in some embodiments.

As shown in FIG. 17, when a feedback voltage $V_F$ transferred from the feedback voltage control circuit 52 is applied to one F1a of the feedback electrodes disposed on the liquid lens, the capacitance measuring circuit 54 connected to the other feedback electrode F1b may measure the capacitance between the two feedback electrodes F1a, F1b, thereby enabling the recognition of the state of the boundary interface 30.

When the feedback voltage $V_F$ is applied and a first switch SW1 in the feedback voltage control circuit 52 is connected, the magnitude of charge Q in the boundary interface 30 may be equal to a value obtained by multiplying variation in feedback voltage $\Delta V_F$ by the capacitance C of the boundary interface 30. When the first switch SW1 is connected, the charge Q may move to a measuring capacitor Cap-m.

Thereafter, when a ground voltage is applied instead of the feedback voltage $V_F$, the first switch SW1 is turned off and a second switch SW2 is turned on, the charge Q, which has moved to the measuring capacitor Cap-m, may move to an on-chip capacitor Cap-on. At this time, the magnitude of charge Q moved to the on-chip capacitor Cap-on may be equal to a value obtained by multiplying variation in feedback voltage $\Delta V_F$ by the capacitance of the on-chip capacitor Cap-on. Although the method of measuring the capacitance by applying the feedback voltage to the feedback electrode has been described with regard to the configuration including the on-chip capacitor Cap-on, the capacitance may be measured with a configuration in which the on-chip capacitor Cap-on is omitted. In this case, the capacitance in the liquid lens may be measured by moving the charge accumulated in the feedback electrode to the measuring capacitor Cap-m and measuring a voltage at opposite ends of the measuring capacitor Cap-m, or by measuring the charge accumulated in the measuring capacitor Cap-m. That is, the capacitance in the liquid lens may be measured with the same method as the sensing method of FIG. 8 or FIG. 10, or may be measured by analogizing the sensing method of FIG. 8 or FIG. 10.

The ratio of the capacitance C of the boundary interface 30 and the capacitance of the on-chip capacitor Cap-on is calculated from the adjusted ratio of the number of couplings by the capacitance C of the boundary interface 30 and the number of couplings by the on-chip capacitor Cap-on so that the total magnitude of charge accumulated in the measuring capacitor Cap-m becomes zero. Since the capacitance of the on-chip capacitor Cap-on is known, the capacitance of the boundary interface 30 may be measured.

The configuration of the capacitance measuring circuit 54 described above may be changed in some embodiments, and an operation and a control method depending on the configuration may be changed. Here, the capacitance measuring circuit 54 may be designed to measure variation in capacitance within a range from a few pF to 200 pF.

Figure 18:
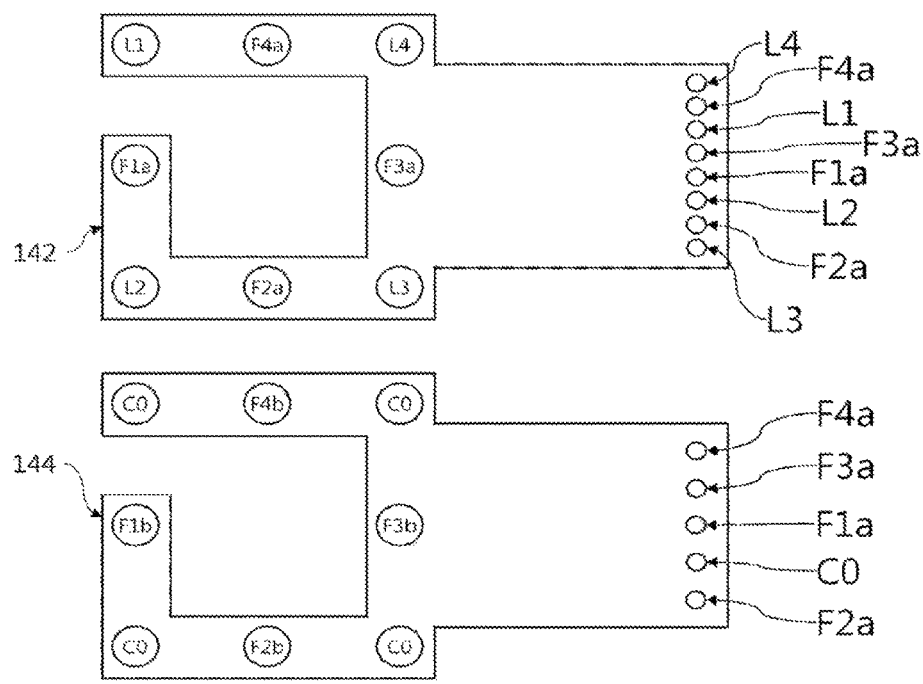
FIG. 18 shows an exemplary connecting unit of the liquid lens.

FIG. 18 shows the connecting unit of the liquid lens.

As shown in FIG. 18, the connecting unit, which connects the liquid lens and a drive circuit (e.g., the control circuit), may include a first connecting unit 142, which supplies a voltage to the respective individual electrodes L1, L2, L3, L4 using a flexible printed circuit board (FPCB), and a second connecting unit 144, which supplies a voltage to the common electrode C0 using a flexible printed circuit board (FPCB). In addition, the first connecting unit 142 and the second connecting unit 144 may include terminals, which connect the feedback voltage control circuit 52 and the capacitance measuring circuit 54 (see FIG. 14) to the feedback electrodes F1a, F2a, F3a, F4a, F1b, F2b, F3b, F4b for measuring the capacitance of the boundary interface 30 (see FIGS. 16(a) and 16(b)). The feedback voltage control circuit 52 serves to supply a feedback voltage $V_F$, and the capacitance measuring circuit 54 (see FIG. 14) serves to measure the capacitance of the boundary interface 30.

The first connecting unit 142 may be electrically connected to four individual electrodes L1, L2, L3, L4 and feedback electrodes F1a, F2a, F3a, F4a. The first connecting unit 142 may be connected to four feedback electrodes. Meanwhile, the second connecting unit 144 serves to apply a common voltage (e.g., a ground voltage, 0V or common DC or common AC), and may be electrically connected to feedback electrodes F1b, F2b, F3b, F4b. The second connecting unit 144 may be connected to four feedback electrodes. The second connecting unit 144 may have a structure corresponding to that of the first connecting unit 142. The terminals, which are disposed on the first connecting unit 142 and the second connecting unit 144 and are connected to the electrodes, may be located at the same angular distance therebetween against the cavity in the liquid lens.

In some embodiments, the liquid lens may include four or eight individual electrodes, or a greater number of individual electrodes than eight electrodes. However, the number of individual electrodes needs to be a multiple of 4. In addition, the number of feedback electrodes disposed on the liquid lens may be the same as or different from the number of individual electrodes included in the liquid lens.

Meanwhile, although FIG. 18 shows the connecting units 142 and 144 as being open on one side thereof, in some embodiments, the connecting unit may be configured to surround the four sides of the liquid lens without an open area.

The capacitance in the liquid lens, which can be calculated or measured by the capacitance measuring circuit, may be transferred to the voltage control circuit. The voltage control circuit, which has received the capacitance in the liquid lens, may recognize the shape or state of the boundary interface in the liquid lens from the capacitance. When the shape or state of the boundary interface in the liquid lens differs from a target shape or value, the voltage control circuit may adjust the drive voltage.

Based on the above description, a liquid lens control circuit may include a voltage control circuit, which supplies a drive voltage to a liquid lens including a common electrode and a plurality of individual electrodes, a capacitance measuring circuit, which calculates the capacitance between the common electrode and the individual electrodes of the liquid lens, and a first switch, which is disposed between the capacitance measuring circuit and the liquid lens and is connected at one end thereof to the liquid lens and the voltage control circuit, thereby controlling the voltage control circuit based on information (e.g., capacitance or voltage) calculated by the capacitance measuring circuit so as to control the drive voltage. In this case, the capacitance measuring circuit may calculate the capacitance between each of the individual electrodes and the common electrode.

In the liquid lens control circuit, when the shape of the boundary interface is changed by the drive voltage, in the state in which a ground voltage is applied to the common electrode to thereby float the common electrode, the first switch is turned on and a voltage applied to at least one of the individual electrodes is changed from a first voltage to a second voltage, which is lower than the first voltage to enable extraction of the capacitance. The common electrode may float during the temporal section for which the first switch is turned on. The liquid lens control circuit may further include a third switch disposed between the voltage control circuit and the first switch and between the voltage control circuit and the liquid lens, and the third switch may be turned on while the voltage is applied to the common electrode and may be turned off while the capacitance measuring circuit measures the information (e.g., capacitance or voltage). The liquid lens may include a first plate in which a conductive liquid and a non-conductive liquid are accommodated, a second plate disposed above the first plate, and a third plate disposed below the first plate. The common electrode may be disposed on the top of the first plate, and the individual electrodes may be disposed on the bottom of the first plate. The capacitance measuring circuit may sequentially calculate the capacitances between the respective individual electrodes and the common electrode.

A method of controlling a liquid lens may include grounding a common electrode of the liquid lens and applying a voltage to any one individual electrode among a plurality of individual electrodes of the liquid lens, inhibiting application of a voltage to the common electrode of the liquid lens, electrically connecting a capacitance measuring circuit to the liquid lens, measuring a voltage at opposite ends of a reference capacitor of the capacitance measuring circuit, and controlling a drive voltage using the measured voltage at the ends of the reference capacitor. The method may further include calculating a capacitance between the common electrode and any one individual electrode among the individual electrodes using the measured voltage at the ends of the reference capacitor of the capacitance measuring circuit. In addition, the method may further include controlling the drive voltage using the calculated information (e.g., capacitance or voltage). The capacitance measuring circuit may sequentially calculate capacitances between the respective individual electrodes and the common electrode. A first switch may be disposed between the voltage control circuit and the common electrode, and the first switch may be turned off to inhibit the application of the voltage to the common electrode of the liquid lens. A second switch may be disposed between the liquid lens and the capacitance measuring circuit, and the second switch may be turned on to electrically connect the capacitance measuring circuit to the liquid lens. The method may further include moving at least some of an accumulated charge to the reference capacitor between the electrically connecting and the measuring. When a shape of an interface in the liquid lens is changed by the drive voltage, in a state where a ground voltage is applied to the common electrode, and thereafter the common electrode enters a floating state, the second switch is turned on, and the capacitance may be calculated during a temporal section for which the voltage of at least one individual electrode among the individual electrodes is changed from a first voltage to a second voltage, which is lower than the first voltage. Information related to the capacitance may be acquired by changing the voltage of the individual electrode from the first voltage to the second voltage during a temporal section for which the common electrode enters a floating state and the switch disposed between the liquid lens and the capacitance measuring circuit is turned on. The method may further include feeding back the calculated information (e.g., voltage or capacitance) to the voltage control circuit.

A lens module may include a liquid lens, a first lens unit and/or a second lens unit, and a printed circuit board. The liquid lens may include a plate having a cavity in which a conductive liquid and a non-conductive liquid are accommodated, a plurality of individual electrodes disposed on the top (or bottom) of the plate, and a common electrode disposed on the bottom (or the top) of the plate, the first lens unit including at least one solid lens may be disposed above the liquid lens, the second lens unit including at least one solid lens may be disposed below the liquid lens, and the printed circuit board may be provided with an image sensor and a voltage control circuit, which is electrically connected to the liquid lens.

The above-described liquid lens may be included in a camera module. The camera module may include a lens assembly including a liquid lens mounted in a housing and at least one solid lens, which may be disposed on the front surface or the back surface of the liquid lens, an image sensor, which converts optical signals transferred via the lens assembly into electrical signals, and a control circuit, which supplies a drive voltage to the liquid lens.

Although some embodiments have been described above, various other embodiments are possible. These embodiments may be combined in various forms so long as the technical ideas of the embodiments are not incompatible, and thus new embodiments may be realized therefrom.

An optical device including the camera module described above may be implemented. Here, the optical device may include a device that may process or analyze optical signals. Examples of the optical device may include camera/video devices, telescopic devices, microscopic devices, an interferometer, a photometer, a polarimeter, a spectrometer, a reflectometer, an auto-collimator, and a lens-meter, and the embodiments may be applied to optical devices that may include the liquid lens. In addition, the optical device may be implemented in a portable device such as, for example, a smart phone, a laptop computer, or a tablet computer. Such an optical device may include a camera module, a display unit configured to output an image, and a body housing in which the camera module and the display unit are mounted. A communication module, which may communicate with other devices, may be mounted in the body housing of the optical device, and the optical device may further include a memory unit capable of storing data.

The method according to the above-described embodiment may be fabricated in a program to be executed in a computer and may be stored in a (non-transitory) computer-readable recording medium, and examples of the computer-readable recording medium may include a ROM, RAM, CD-ROM, magnetic tape, floppy disc, or optical data storage device.

The computer-readable recording medium may be dispersed in computer systems interconnected via a network, and may store and execute computer-readable codes in a distributed manner. In addition, functional programs, codes, and code segments for realizing the above-described method may be easily deduced by programmers skilled in the art of the embodiments.

It will be apparent to those skilled in the art that the disclosure may be embodied into other particular forms within a range not deviating from the scope and essential features of the disclosure. Thus, the above detailed description should not be construed as being limitative in all terms, but should be considered as being illustrative. The scope of the disclosure should be determined by the rational analysis of the accompanying claims, and all changes within the equivalent range of the disclosure are included in the scope of the disclosure.

What is claimed is:

1. A device for controlling a liquid lens, comprising:
a liquid lens including a common electrode and a plurality of individual electrodes;
a voltage control circuit configured to supply a driving voltage to the liquid lens in order to control an interface in the liquid lens;
a capacitance measuring circuit configured to measure a capacitance between the common electrode and at least one individual electrode of the plurality of individual electrodes in the liquid lens; and
a first switch located between the capacitance measuring circuit and the liquid lens,
wherein one side of the first switch is electrically coupled with the liquid lens and the voltage control circuit, and
wherein the voltage control circuit is configured to control the driving voltage based on information determined by the capacitance measured by the capacitance measuring circuit.

2. The device according to claim 1, wherein the capacitance measuring circuit is configured to measure the capacitance between the common electrode and each individual electrode of the plurality of individual electrodes.

3. The device according to claim 1, wherein,
when the common electrode is floating after a ground voltage is supplied to the common electrode after a shape of the interface is changed by the driving voltage, the capacitance is measured during a period when the first switch is turned on and a voltage supplied to the at least one individual electrode is changed from a first voltage to a second voltage having a lower level than the first voltage.

4. The device according to claim 1, wherein the first switch is turned off when the voltage control circuit supplies the driving voltage to the liquid lens for operating the liquid lens.

5. The device according to claim 1, wherein the voltage control circuit is configured to generate the driving voltage used for operating the liquid lens as well as to accumulate electric charge used for measuring the capacitance between the common electrode and the at least one individual electrode.

6. The device according to claim 1, wherein the capacitance measuring circuit includes a reference capacitor, and
wherein the capacitance between the common electrode and the at least one individual electrode is measured by using the reference capacitor.

7. The device according to claim 1, wherein the capacitance measuring circuit is coupled with the common electrode.

8. The device according to claim 1, wherein the voltage control circuit includes:
a first voltage control circuit configured to supply a common electrode voltage to the common electrode; and
a second voltage control circuit configured to supply an individual electrode voltage to the plurality of individual electrodes.

9. The device according to claim 8, wherein the first voltage control circuit includes a second switch configured to supply a ground voltage to the common electrode.

10. The device according to claim 3, wherein the second voltage is a ground voltage.

11. The device according to claim 1, wherein the capacitance measuring circuit delivers the information determined by the capacitance to the voltage control circuit.

12. The device according to claim 1, wherein the information determined by the capacitance measured by the capacitance measuring circuit is a value of voltage or a value of capacitance.

13. The device according to claim 10, wherein the common electrode is floating during a period when the first switch is turned on.

14. The device according to claim 3, further comprising a third switch located between the voltage control circuit and the first switch and between the voltage control circuit and the liquid lens,
wherein the third switch is turned on when a common electrode voltage is supplied to the common electrode, and turned off when the capacitance measuring circuit measures the capacitance.

15. The device according to claim 1, wherein the capacitance measuring circuit is configured to feed back the capacitance to the voltage control circuit so that the voltage control circuit is configured to control the driving voltage based at least on the capacitance.

16. A camera module, comprising:
an image sensor;
a lens assembly on the image sensor, the lens assembly including a liquid lens and at least one solid lens, and the liquid lens including a common electrode and a plurality of individual electrodes;
a voltage control circuit configured to supply a driving voltage into the liquid lens in order to control an interface in the liquid lens;
a capacitance measuring circuit configured to measure a capacitance between the common electrode and the plurality of individual electrodes in the liquid lens; and a first switch located between the capacitance measuring circuit and the liquid lens, wherein one side of the first switch is electrically coupled with the liquid lens and the voltage control circuit, wherein the liquid lens includes a second plate, a third plate, and a first plate disposed between the second plate and the third plate, wherein the first plate includes a cavity comprising a conductive liquid and a non-conductive liquid, wherein the common electrode is located between the first plate and the third plate, and the plurality of individual electrodes are located between the first plate the second plate, and wherein the capacitance between the common electrode and the plurality of individual electrodes in the liquid lens includes a plurality of capacitances sequentially measured between the common electrode and each individual electrode of the plurality of individual electrodes.

17. The camera module according to claim 16, wherein the plurality of individual electrodes includes four individual electrodes respectively located at four corners of the first plate, and wherein the driving voltage is controlled in response to the capacitance which is measured by the capacitance measuring circuit and fed back into the voltage control circuit so that a focal distance of the lens assembly is adjusted.

18. A method for controlling a liquid lens, the method comprising:

supplying a ground voltage to a common electrode of the liquid lens and an individual electrode voltage to at least one individual electrode of a plurality individual electrodes of the liquid lens to accumulate electric charge between the common electrode and the at least one individual electrode of the plurality of individual electrodes;

floating the common electrode of the liquid lens;

turning on a first switch located between the liquid lens and a capacitance measuring circuit;

measuring a reference voltage between both sides of a reference capacitor in the capacitance measuring circuit;

measuring a capacitance between the common electrode and the at least one individual electrode of the plurality of individual electrodes by using the reference voltage; and controlling a driving voltage based on the information determined by the measured capacitance, wherein the capacitance includes a plurality of capacitances sequentially measured between the common electrode and each individual electrode of the plurality of individual electrodes.

19. The method according to claim 18, further comprising:

after turning on the first switch and before measuring the reference voltage, moving at least part of the electric charge accumulated between the common electrode and the at least one individual electrode of the plurality of individual electrodes to the reference capacitor, and feeding back the capacitance to a voltage control circuit.

* * * * *